United States Patent
Tamura et al.

(10) Patent No.: US 9,536,875 B2
(45) Date of Patent: Jan. 3, 2017

(54) SEMICONDUCTOR DEVICE

(71) Applicant: FUJI ELECTRIC CO., LTD., Kawasaki-shi (JP)

(72) Inventors: Masaki Tamura, Nagano (JP); Souichi Yoshida, Matsumoto (JP); Shinichiro Adachi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/882,427

(22) Filed: Oct. 13, 2015

(65) Prior Publication Data
US 2016/0043073 A1    Feb. 11, 2016

Related U.S. Application Data

(63) Continuation of application No. PCT/JP2014/076633, filed on Oct. 3, 2014.

(30) Foreign Application Priority Data

Oct. 4, 2013    (JP) .................................. 2013-209632

(51) Int. Cl.
| | |
|---|---|
| *H01L 27/06* | (2006.01) |
| *H01L 29/45* | (2006.01) |
| *H01L 29/66* | (2006.01) |
| *H01L 29/739* | (2006.01) |
| *H01L 29/06* | (2006.01) |

(Continued)

(52) U.S. Cl.
CPC ....... *H01L 27/0664* (2013.01); *H01L 29/0696* (2013.01); *H01L 29/0834* (2013.01); *H01L 29/1095* (2013.01); *H01L 29/456* (2013.01); *H01L 29/66348* (2013.01); *H01L 29/7397* (2013.01)

(58) Field of Classification Search
CPC ............. H01L 27/0664; H01L 29/0696; H01L 29/0834; H01L 29/1095; H01L 29/456; H01L 29/66348; H01L 29/7397
See application file for complete search history.

(56) References Cited

U.S. PATENT DOCUMENTS

| | | |
|---|---|---|
| 8,809,911 B2 | 8/2014 | Yoshikawa |
| 2005/0045960 A1 | 3/2005 | Takahashi |
| (Continued) | | |

FOREIGN PATENT DOCUMENTS

| | | |
|---|---|---|
| DE | 112011100533 T5 | 12/2012 |
| JP | H10-163469 A | 6/1998 |
| (Continued) | | |

*Primary Examiner* — Jarrett Stark
(74) *Attorney, Agent, or Firm* — Rabin & Berdo, P.C.

(57) ABSTRACT

An IGBT is disposed in an IGBT portion, and an FWD is disposed in an FWD portion. A p-type base region and an n⁻-type drift region are alternately exposed in a trench longitudinal direction in a substrate front surface in a mesa portion between neighboring trenches in the IGBT portion. A p-type anode region and the n⁻-type drift region are alternately exposed in the trench longitudinal direction in the substrate front surface in a mesa portion in the FWD portion, and a repetitive structure is formed with a portion of the n⁻-type drift region sandwiched between p-type anode regions and one p-type anode region in contact with the portion as one unit region. The proportion occupied by the p-type anode region in one unit region (an anode ratio) (α) is 50% to 100%.

12 Claims, 38 Drawing Sheets

(51) Int. Cl.
*H01L 29/08* (2006.01)
*H01L 29/10* (2006.01)

(56) References Cited

U.S. PATENT DOCUMENTS

| | | | |
|---|---|---|---|
| 2007/0252195 | A1 | 11/2007 | Yoshikawa et al. |
| 2008/0048295 | A1 | 2/2008 | Takahashi |
| 2009/0072339 | A1 | 3/2009 | Tsuzuki et al. |
| 2009/0283798 | A1 | 11/2009 | Tsuzuki et al. |
| 2010/0156506 | A1 | 6/2010 | Tsuzuki et al. |
| 2011/0140180 | A1 | 6/2011 | Kitagawa |
| 2012/0043581 | A1 | 2/2012 | Koyama et al. |
| 2013/0240947 | A1 | 9/2013 | Matsudai et al. |
| 2014/0048847 | A1 | 2/2014 | Yamashita et al. |

FOREIGN PATENT DOCUMENTS

| | | | |
|---|---|---|---|
| JP | 2000-049359 | A | 2/2000 |
| JP | 2005-101514 | A | 4/2005 |
| JP | 2008-034794 | A | 2/2008 |
| JP | 2008-047565 | A | 2/2008 |
| JP | 2008-053648 | A | 3/2008 |
| JP | 2008-192737 | A | 8/2008 |
| JP | 2009-027152 | A | 2/2009 |
| JP | 2009-071217 | A | 4/2009 |
| JP | 2010-171385 | A | 8/2010 |
| JP | 2011-146682 | A | 7/2011 |
| JP | 2012-009629 | A | 1/2012 |
| JP | 2012-043890 | A | 3/2012 |
| JP | 2012-231092 | A | 11/2012 |
| JP | 2013-012783 | A | 1/2013 |
| JP | 2013-197122 | A | 9/2013 |
| WO | WO 2013-014943 | A2 | 1/2013 |

SEMICONDUCTOR DEVICE

This application is a continuation under 35 U.S.C. 120 of International Application PCT/JP2014/076633 having the International Filing Date of Oct. 3, 2014, and having the benefit of the earlier filing date of Japanese Application No. 2013-209632, filed Oct. 4, 2013. Each of the identified applications is fully incorporated herein by reference.

BACKGROUND

Technical Field

The present invention relates to a semiconductor device.

Background Art

In response to demand for a reduction in size and an increase in performance in power supply instruments in the field of power electronics in recent years, efforts have been focused on improving performance with respect to increasing breakdown voltage, increasing current, reducing loss, increasing breakdown resistance, and increasing speed in power semiconductors. A MOS power device driven by a MOS gate (an insulated gate formed of metal-oxide-semiconductor) is commonly known as a power semiconductor device wherein increasing current and reducing loss are possible.

Two kinds of structure are widely known as MOS gate structures of the MOS power device, those being a planar gate structure, wherein a MOS gate is provided in plate form on a semiconductor substrate, and a trench gate structure, wherein a MOS gate is embedded in a trench formed in a semiconductor substrate. The trench gate structure is attracting attention in recent vertical power devices, as the structure thereof is such that low on-state resistance characteristics are easily obtained.

A device wherein the surfaces of a p-type channel region and an n-type semiconductor substrate are disposed so as to appear alternately in a longitudinal direction between parallel trenches, and the surface form of an $n^+$-type emitter region selectively formed in a surface layer of the p-type channel region is wider on the trench side and becomes narrower toward the center between trenches, has been proposed as a vertical MOS power device with this trench gate structure (for example, refer to PTL 1).

Also, as another vertical MOS power device, there have also been advancements in the development of a reverse conducting IGBT (RC-IGBT) of a structure wherein an insulated gate bipolar transistor (IGBT) and a freewheeling diode (FWD) connected in anti-parallel to the IGBT are integrated by being incorporated in the same semiconductor substrate (semiconductor chip), in order to achieve a reduction in size of a whole power conversion device.

A description will be given of an existing RC-IGBT. FIG. 18 is a plan view showing the structure of the existing RC-IGBT. FIG. 19 is a sectional view showing the sectional structure along a cutting line AA-AA' of FIG. 18. As shown in FIGS. 18 and 19, the existing RC-IGBT includes a general field stop IGBT (FS-IGBT) and an FWD connected in anti-parallel to the FS-IGBT on the same $n^-$-type semiconductor substrate, which forms an $n^-$-type drift region 101.

Normally, in order to connect an FWD in anti-parallel to an FS-IGBT, an RC-IGBT has a structure wherein, taking a p-type base region configuring a MOS gate structure on the front surface side of an $n^-$-type semiconductor substrate to be a p-type anode region 105-2, one portion of a $p^+$-type collector region 111 provided on the back surface side of the $n^-$-type semiconductor substrate is replaced with an $n^+$-type cathode region 112. Specifically, an IGBT portion 121 in which an FS-IGBT is provided and an FWD portion 122 in which an FWD is provided are provided on the same $n^-$-type semiconductor substrate.

A trench gate type MOS gate structure formed of a trench 102, gate insulating film 103, gate electrode 104, p-type base region 105-1, $n^+$-type emitter region 106, and $p^+$-type contact region 107, and an emitter electrode 109, are provided on the front surface side of the $n^-$-type semiconductor substrate in the IGBT portion 121. The p-type base region 105-1 is disposed at predetermined intervals in the longitudinal direction of the trench 102 in a mesa portion (a region sandwiched between neighboring trenches 102) between neighboring trenches 102.

The trench gate formed of the trench 102, gate insulating film 103, and gate electrode 104 is provided in a stripe form extending in a direction (the longitudinal direction) perpendicular to the direction in which the IGBT portion 121 and FWB portion 122 are aligned (the lateral direction) from the IGBT portion 121 across the FWB portion 122. The p-type anode region 105-2 is provided over the whole of the front surface of the $n^-$-type semiconductor substrate in a mesa portion between neighboring trenches 102 in the FWD portion 122.

The p-type anode region 105-2 is conductively connected to the emitter electrode 109. On the back surface side of the $n^-$-type semiconductor substrate, the $p^+$-type collector region 111 is provided in the IGBT portion 121 and the $n^+$-type cathode region 112 is provided in the FWD portion 122. An n-type buffer layer 110 is provided between the $p^+$-type collector region 111 and $n^+$-type cathode region 112 and the n-type drift region 101. A collector electrode 113 is in contact with the $p^+$-type collector region 111 and $n^+$-type cathode region 112. Reference sign 108 is an interlayer dielectric.

A collector short device wherein a MOS gate structure is repeatedly disposed in a pattern the same as that of a normal IGBT on the front surface of a semiconductor chip, and an FWD portion $n^+$-type cathode region and IGBT portion $p^+$-type collector region are disposed in parallel on the back surface of the semiconductor chip, has been proposed as this kind of RC-IGBT (for example, refer to PTL 2).

Also, a device wherein an IGBT portion acting as an IGBT element and a diode region acting as a diode element are repeatedly, alternately disposed on a semiconductor substrate including an $n^-$-type drift layer, and a p-type Schottky contact region that extracts holes from the $n^-$-type drift layer is provided in a surface layer portion of the $n^-$-type drift layer in a portion of the diode region farthest to the IGBT portion side, has been proposed as another RC-IGBT (for example, refer to PTL 3).

Also, a device of a structure wherein an emitter layer is provided in a first region on a first main surface side of a semiconductor substrate but no emitter layer is provided in a second region, and of a structure wherein a collector layer is provided in a first region on a second main surface side of the semiconductor substrate and a cathode layer is provided in a second region, has been proposed as another RC-IGBT (for example, refer to PTL 4).

Also, a device wherein multiple trench gates are formed at differing intervals on a substrate front surface side of a diode portion, and furthermore, an n-type emitter region and p-type base region are formed between trench gates formed at a shorter interval, has been proposed as another RC-IGBT (for example, refer to PTL 5).

Also, a semiconductor device that is a vertical diode including trenches on a substrate front surface side, wherein the trenches are disposed at differing intervals, and includes two regions, those being a region in which the intervals between trenches in the lateral direction of the trench are long and a region in which the intervals are short, has been proposed as a device including a mesa portion (for example, refer to PTL 6).

Also, the following device has been proposed as another RC-IGBT. Barrier metal is formed using titanium (Ti), tungsten (W), or the like on the surface of an interlayer dielectric and the inner surface of a second trench. An emitter (anode) electrode is in contact with a p-type base (anode) layer, an n-type emitter region, and a p-type contact region via the barrier metal (for example, refer to PTL 7 (Paragraphs 0054 and 0080, FIG. 5)).

Also, the following device has been proposed as another RC-IGBT. A back surface electrode is formed on a second main surface so as to be in contact with both a p-type collector region and an n-type cathode region, and has a titanium layer, a nickel (Ni) layer, and a gold (Au) layer stacked sequentially from the second main surface side. The titanium layer forms ohmic contact to both the p-type collector region and n-type cathode region (for example, refer to PTL 8).

Also, a device wherein IGBT regions and FWD regions are alternately provided adjacent to each other, and which has two kinds of FWD region of differing widths, has been proposed as another RC-IGBT (for example, refer to PTL 9 (Paragraph 0068, FIG. 6)). In PTL 9, by the width of an FWD region acting as a wide region (the distance between two channels sandwiching an FWD region acting as a narrow region) being 170 μm or more, the ratio of a region that does not function as an FWD region is relatively low, and forward voltage snapback is thus restricted.

Also, the following device has been proposed as another RC-IGBT. A floating layer deeper than an emitter region and contact region in a trench depth direction is provided in a p-type base layer of an IGBT portion. No floating layer or emitter region is provided in a diode portion. A gate electrode of the diode portion is of the emitter potential (for example, refer to PTL 10). In PTL 10, excessive hole implantation from the contact region of the IGBT portion to the diode portion is prevented by providing the floating layer.

CITATION LIST

Patent Literature

PTL 1: JP-A-2008-034794
PTL 2: JP-A-2005-101514
PTL 3: JP-A-2009-071217
PTL 4: JP-A-2008-053648
PTL 5: JP-A-2012-009629
PTL 6: JP-A-2008-047565
PTL 7: JP-A-2009-027152
PTL 8: JP-A-2013-012783
PTL 9: JP-A-2010-171385
PTL 10: JP-A-2012-043890

However, the heretofore described existing technology is such that trenches are disposed at a comparatively short pitch in an IGBT portion in a stripe form extending in a direction perpendicular to the direction in which the trenches are aligned. Therefore, when no trench is provided penetrating a Schottky junction of a p-type anode region (p-type base region) and n⁻-type drift layer from the substrate front surface in an FWD portion, there is a problem in that electrical field intensity concentrates in a bottom portion of a trench provided farthest to the FWD portion side in the IGBT portion in an off-state, and breakdown voltage decreases.

Also, in PTL 2, as the FWD portion is partially provided over the whole of the IGBT portion, carriers are extracted from the FWD portion, there is a decrease in carriers in the IGBT portion, and on-state resistance increases, because of which there is concern that on-state voltage will increase. Also, in a configuration wherein a p-type anode region is provided over the whole of the substrate front surface side of an FWD portion, as in PTL 4, electrical field intensity in the FWD portion is relaxed, but hole implantation efficiency increases in the FWD portion, and reverse recovery current increases, because of which there is a problem in that IGBT turn-on loss increases, and FWD reverse recovery resistance decreases.

SUMMARY

The invention, in order to resolve the problems of the heretofore described existing technology, has an object of providing a semiconductor device such that diode characteristics can be improved in a reverse conducting semiconductor device of a structure wherein an insulated gate bipolar transistor and a diode are integrated by being incorporated in the same semiconductor substrate.

In order to resolve the heretofore described problems, thereby achieving the object of the invention, a semiconductor device according to the invention is a semiconductor device including a first element region in which an insulated gate bipolar transistor is provided and a second element region in which a diode is provided on a semiconductor substrate that forms a first conductivity type drift region, and has the following characteristics. A plurality of trenches are provided in stripe form extending in a longitudinal direction perpendicular to the direction in which the first element region and second element region are aligned from the first element region across the second element region in the front surface of the semiconductor substrate. A gate insulating film is provided along the side walls and bottom surface of the trench. A gate electrode is provided on the inner side of the gate insulating film inside the trench. A second conductivity type base region is selectively provided in a mesa portion between neighboring trenches of the first element region. A second conductivity type anode region is selectively provided in a mesa portion between neighboring trenches of the second element region. A first conductivity type emitter region is selectively provided inside the base region. A first electrode in contact with the base region, emitter region, and anode region is provided. A second conductivity type collector region is provided on the back surface of the semiconductor substrate in the first element region. A first conductivity type cathode region is provided on the back surface of the semiconductor substrate in the second element region. A second electrode in contact with the collector region and cathode region is provided. Further, the anode region and drift region are repeatedly, alternately disposed in the trench longitudinal direction in a mesa portion between neighboring trenches of the second element region. The proportion occupied by the anode region of a unit region formed of the anode region and the drift region in a portion sandwiched by the anode region and the anode region neighboring the anode region in the trench longitudinal direction is 50% or more and less than 100%.

Also, the heretofore described semiconductor device according to the invention is characterized in that built-in depletion layers spreading into the mesa portion from each of neighboring anode regions are linked to each other.

Also, in order to resolve the heretofore described problems, thereby achieving the object of the invention, a semiconductor device according to the invention is a semiconductor device including a first element region in which an insulated gate bipolar transistor is provided and a second element region in which a diode is provided on a semiconductor substrate that forms a first conductivity type drift region, and has the following characteristics. A plurality of trenches are provided in stripe form extending in a longitudinal direction perpendicular to the direction in which the first element region and second element region are aligned from the first element region across the second element region in the front surface of the semiconductor substrate. A gate insulating film is provided along the side walls and bottom surface of the trench. A gate electrode is provided on the inner side of the gate insulating film inside the trench. A second conductivity type base region is selectively provided in a mesa portion between neighboring trenches of the first element region. A second conductivity type anode region is selectively provided in a mesa portion between neighboring trenches of the second element region. A first conductivity type emitter region is selectively provided inside the base region. A first electrode in contact with the base region, emitter region, and anode region is provided. A second conductivity type collector region is provided on the back surface of the semiconductor substrate in the first element region. A first conductivity type cathode region is provided on the back surface of the semiconductor substrate in the second element region. A second electrode in contact with the collector region and cathode region is provided. Further, the anode region and drift region are repeatedly, alternately disposed in the trench longitudinal direction in a mesa portion between neighboring trenches of the second element region. The first electrode is further in contact with the drift region in the second element region. The proportion occupied by the anode region of a unit region formed of the anode region and the drift region in a portion sandwiched by the anode region and the anode region neighboring the anode region in the trench longitudinal direction is less than 50%.

Also, the heretofore described semiconductor device according to the invention is characterized in that built-in depletion layers spreading from each of neighboring trenches into a mesa portion between the trenches are linked to each other.

Advantageous Effects of Invention

According to the semiconductor device according to the invention, there is an advantage in that reverse recovery current can be reduced, and reverse recovery loss can thus be reduced, in a reverse conducting semiconductor device of a structure wherein an insulated gate bipolar transistor and a diode are integrated by being incorporated in the same semiconductor substrate, because of which diode characteristics can be improved.

DETAILED DESCRIPTION

Hereafter, referring to the attached drawings, a detailed description will be given of preferred embodiments of a semiconductor device according to the invention. A layer or region being prefixed by n or p in the specifications or attached drawings means that electrons or holes respectively are majority carriers. Also, + or − attached to n or p indicates a higher impurity concentration or lower impurity concentration respectively than in a layer or region to which neither is attached. In the following description of the embodiments and in the attached drawings, the same reference signs are given to the same configurations, and redundant descriptions are omitted.

(Embodiment 1)

Figure 1:
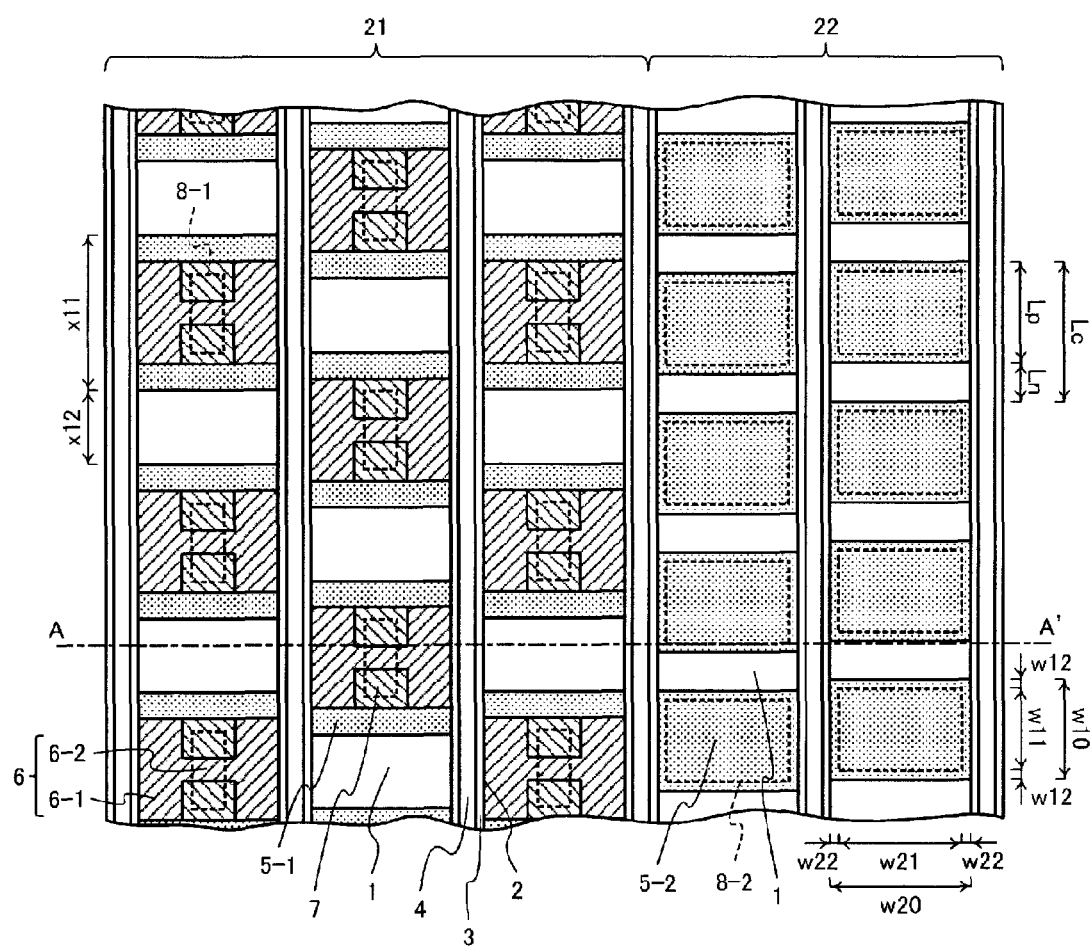
FIG. 1 is a plan view showing the structure of a semiconductor device according to Embodiment 1.
Figure 2:
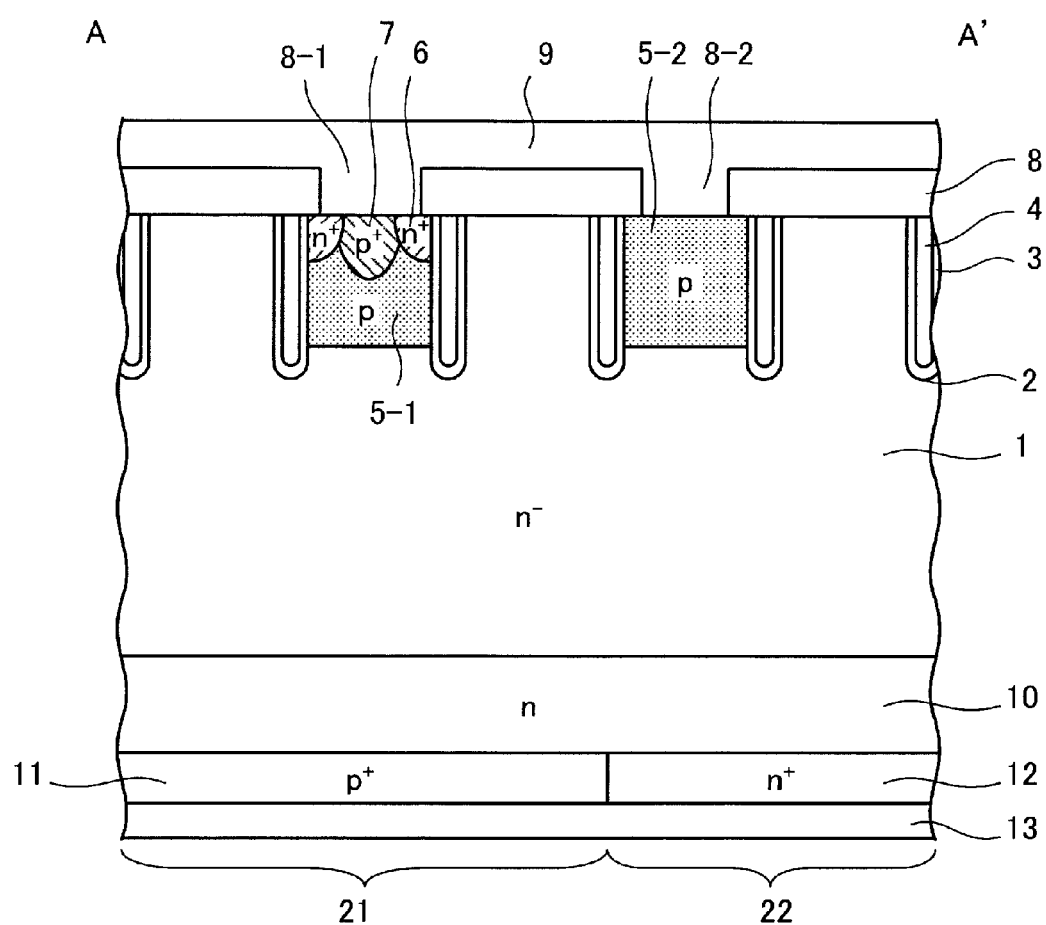
FIG. 2 is a sectional view showing the sectional structure along a cutting line A-A' of FIG. 1.

A description will be given of the configuration of a semiconductor device according to Embodiment 1. FIG. 1 is a plan view showing the structure of the semiconductor device according to Embodiment 1. FIG. 2 is a sectional view showing the sectional structure along a cutting line A-A' of FIG. 1. As shown in FIGS. 1 and 2, the semiconductor device according to Embodiment 1 includes an IGBT portion 21, in which an insulated gate bipolar transistor (IGBT) is provided, and an FWD portion 22, in which a freewheeling diode (FWD) is provided, on the same n⁻-type semiconductor substrate, which forms an n⁻-type drift region 1.

The FWD of the FWD portion 22 is connected in anti-parallel to the IGBT of the IGBT portion 21. That is, the semiconductor device according to Embodiment 1 is a reverse conducting IGBT (RC-IGBT). A multiple of a trench 2 are provided at predetermined intervals in a stripe form extending in a direction (the longitudinal direction) perpendicular to the direction in which the IGBT portion 21 and FWB portion 22 are aligned (the lateral direction), from the IGBT portion 21 across the FWB portion 22, on the front surface of the n⁻-type semiconductor substrate.

A gate insulating film 3 is provided inside the trench 2 along the inner wall of the trench 2. Also, a gate electrode 4 is provided on the inner side of the gate insulating film 3 inside the trench 2. In the IGBT portion 21, a p-type base region 5-1 is provided at predetermined intervals in the trench 2 longitudinal direction in a mesa portion between neighboring trenches 2. The p-type base region 5-1 is provided so as to be in contact with the trench 2, and to a depth (a depth from the substrate front surface) less than that of the trench 2.

That is, in the IGBT portion 21, the p-type base region 5-1 and n⁻-type drift region 1 are alternately exposed in the trench 2 longitudinal direction on the front surface of the n⁻-type semiconductor substrate. A width x11 in the trench 2 longitudinal direction of the p-type base region 5-1 is greater than the width in the trench 2 longitudinal direction of a portion of the n⁻-type drift region 1 sandwiched by the p-type base region 5-1, that is, a first pitch (disposition interval) x12 in the trench 2 longitudinal direction of the p-type base region 5-1 (x11>x12). An n⁺-type emitter region 6 and a p⁺-type contact region 7 are selectively provided inside the p-type base region 5-1.

The n⁺-type emitter region 6 is in contact with the gate insulating film 3 provided on the side walls of the trench 2, and opposes the gate electrode 4 across the gate insulating film 3. The n⁺-type emitter region 6 is formed of, for example, a first n⁺-type region 6-1, provided on the side of each trench 2 sandwiching the p-type base region 5-1, and a second n⁺-type region 6-2 provided between first n⁺-type regions 6-1 and linking the first n⁺-type regions 6-1. The trench 2 longitudinal direction width of the second n⁺-type region 6-2 is, for example, less than the trench 2 longitudinal direction width of the first n⁺-type region 6-1, whereby the n⁺-type emitter region 6 has, for example, an H-shaped planar form.

The p⁺-type contact region 7 is provided between first n⁺-type regions 6-1, and in contact with the n⁺-type emitter region 6. In this way, the IGBT portion 21 on the front surface side of the n⁻-type semiconductor substrate is of a structure wherein, with the p-type base region 5-1 disposed thinned out, a trench gate type MOS gate structure formed of the trench 2, gate insulating film 3, gate electrode 4, p-type base region 5-1, n⁺-type emitter region 6, and p⁺-type contact region 7 is repeatedly disposed in the trench 2 longitudinal direction. Each MOS gate configures an IGBT (cell portion).

In the FWD portion 22, the trench 2 of the FWD portion 22 is also of a trench gate structure, in the same way as the trench 2 of the IGBT portion 21, in order to simplify the manufacturing process by unifying the wiring layout in the IGBT portion 21 and FWD portion 22. In the FWD portion 22, a p-type anode region 5-2 is provided at predetermined intervals in the trench 2 longitudinal direction in a mesa portion between neighboring trenches 2. That is, the p-type anode region 5-2 and n⁻-type drift region 1 are alternately exposed in the trench 2 longitudinal direction on the front surface of the n⁻-type semiconductor substrate.

In this way, a p-type base region provided in a mesa portion between neighboring trenches 2 in the FWD portion 22 configures the p-type anode region 5-2. A p⁺-type contact region may be provided inside the p-type anode region 5-2. Hereafter, a description will be given with a case wherein no p⁺-type contact region is formed in the FWD portion 22 as an example. The p-type anode region 5-2 is provided in contact with the trench 2, and to a depth less than that of the trench 2. The impurity concentration of the p-type anode region 5-2 may be equal to the impurity concentration of the p-type base region 5-1, or may be lower than the impurity concentration of the p-type base region 5-1.

The FWD portion 22 on the front surface side of the n⁻-type semiconductor substrate is of a structure such that the p-type anode region 5-2 is repeatedly disposed in the trench 2 longitudinal direction, wherein each p-type anode region 5-2 configures an FWD (cell portion). Specifically, a repetitive structure wherein a portion of the n⁻-type drift region 1 sandwiched by p-type anode regions 5-2 neighboring in the trench 2 longitudinal direction (hereafter referred to as a portion of the n⁻-type drift region 1 sandwiched by the p-type anode region 5-2), and one p-type anode region 5-2 in contact with this portion, is taken to be one unit (hereafter referred to as a unit region) is formed in a mesa portion between neighboring trenches 2. A description will be given hereafter of a proportion (hereafter referred to as an anode ratio) α of one unit region occupied by the p-type anode region 5-2. It is good when a width w10 in the trench 2 longitudinal direction of the p-type anode region 5-2 is, for example, greater than a width (that is, mesa width) w20 in the trench 2 lateral direction of the mesa portion. The reason for this is that the anode ratio α is easily set within a preferred range to be described hereafter.

The front surface of the n⁻-type semiconductor substrate is covered with an interlayer dielectric 8 having first and second contact holes 8-1 and 8-2. The first contact hole 8-1 is provided in each cell portion of the IGBT portion 21, and the n⁺-type emitter region 6 and p⁺-type contact region 7 of one cell portion are exposed in one first contact hole 8-1. The second contact hole 8-2 is provided in each cell portion of the FWD portion 22, and the p-type anode region 5-2 of one cell portion is exposed in one second contact hole 8-2. The n⁻-type drift region 1 is not exposed in the first and second contact holes 8-1 and 8-2.

It is preferable that an aperture width w11 in the trench 2 longitudinal direction of the second contact hole 8-2 and an aperture width w21 in the trench 2 lateral direction of the second contact hole 8-2 are of a size such that practically the whole of the p-type anode region 5-2 can be exposed. The reason for this is that contact resistance can be reduced, and on-state voltage can thus be reduced. Specifically, taking deviation in the alignment of an etching mask for forming the second contact hole 8-2 into consideration, it is good when the aperture width w11 in the trench 2 longitudinal direction of the second contact hole 8-2 and aperture width w21 in the trench 2 lateral direction of the second contact hole 8-2 are slightly smaller than the width w10 in the trench 2 longitudinal direction of the p-type anode region 5-2 and the width (mesa width w20 between trenches 2) in the trench 2 lateral direction of the p-type anode region 5-2 respectively.

More specifically, the aperture width w11 in the trench 2 longitudinal direction of the second contact hole 8-2 may be reduced so that both end portions in the trench 2 longitudinal direction of the second contact hole 8-2 are positioned a width w12 (in the region of, for example, 0.5 μm to 1.0 μm) to the inner side of the p-type anode region 5-2 from the boundary between the p-type anode region 5-2 and n⁻-type drift region 1. The aperture width w21 in the trench 2 lateral direction of the second contact hole 8-2 may be reduced so that both end portions in the trench 2 lateral direction of the second contact hole 8-2 are positioned a width w22 (in the region of, for example, 0.5 μm to 1.0 μm) to the inner side of the p-type anode region 5-2 from the boundary between the p-type anode region 5-2 and the inner wall of the trench 2.

An emitter electrode 9 is in contact with the n⁺-type emitter region 6 and p⁺-type contact region 7 via the first contact hole 8-1. Also, the emitter electrode 9, doubling as an anode electrode, is in contact with the p-type anode region 5-2 via the second contact hole 8-2. The emitter electrode 9 is electrically isolated from the gate electrode 4 by the interlayer dielectric 8. A p⁺-type collector region 11 is provided in the IGBT portion 21, and an n⁺-type cathode region 12 provided in the FWD portion 22, in a surface layer of the n⁻-type semiconductor substrate back surface.

An n-type buffer layer 10 is provided between the p⁺-type collector region 11 and n⁺-type cathode region 12 and the n⁻-type drift region 1. The n-type buffer layer 10 has a function as an n-type field stop layer that restricts so that a depletion layer spreading from the p-n junctions between the p-type base region 5-1 and p-type anode region 5-2 and the n⁻-type drift region 1 when in an off-state does not reach the p⁺-type collector region 11. A collector electrode 13 is in contact with the p⁺-type collector region 11. Also, the collector electrode 13, doubling as a cathode electrode, is in contact with the n⁺-type cathode region 12.

Next, a description will be given of the anode ratio α. The anode ratio α can be expressed as the proportion of the area of the p-type anode region 5-2 exposed on the substrate front surface in one unit region disposed in a mesa portion between neighboring trenches 2 with respect to the area of the unit region exposed on the substrate front surface (surface area). Specifically, the anode ratio α is expressed by Expression (1) below. The anode ratio α is set based on a width (not including an increase caused by thermal diffusion) Lp in the trench 2 longitudinal direction of the p-type anode region 5-2, taking deviation in the alignment of an ion implantation mask for forming the p-type anode region 5-2, and the like, into consideration.

$$\alpha = Lp/Lc = Lp/(Lp+Ln) \tag{1}$$

Specifically, the anode ratio α is taken to be, for example, 50% to 75%. That is, the p-type anode region 5-2 is disposed thinned out so that the area of the p-type anode region 5-2 exposed before thermal diffusion is equal to or greater than the area of the n⁻-type drift region 1 exposed on the substrate front surface in one unit region disposed in a mesa portion between neighboring trenches 2 in the FWD portion 22. Preferably, it is good when the anode ratio α is near 75%. Thinning out the p-type anode region 5-2 means providing a region in which the p-type anode region 5-2 is not disposed, thereby causing the n⁻-type drift region 1 and p-type anode region 5-2 to be exposed alternately in the trench 2 longitudinal direction.

The width (not including an increase caused by thermal diffusion) Lp in the trench 2 longitudinal direction of the p-type anode region 5-2 is the width in the trench 2 longitudinal direction of an aperture portion (an aperture portion that exposes the formation region of the p-type anode region 5-2) of an ion implantation mask for forming the p-type anode region 5-2. That is, the width (not including an increase caused by thermal diffusion) Lp in the trench 2 longitudinal direction of the p-type anode region 5-2, not including an increase in the width in the trench 2 longitudinal direction of the p-type anode region 5-2 diffused by thermal diffusion processing after an ion implantation, is less than the width w10 in the trench 2 longitudinal direction of the p-type anode region 5-2 after thermal diffusion.

Ln is the width in the trench 2 longitudinal direction of a portion of the n⁻-type drift region 1 sandwiched by the p-type anode region 5-2 (that is, a second pitch in the trench 2 longitudinal direction of the p-type anode region 5-2). Lc is the sum of the width (not including an increase caused by thermal diffusion) Lp in the trench 2 longitudinal direction of the p-type anode region 5-2 and the width Ln in the trench 2 longitudinal direction of a portion of the n⁻-type drift region 1 sandwiched by the p-type anode region 5-2 (hereafter referred to as unit length). Although Lp, Ln, and Lc are the widths in the trench 2 longitudinal direction of each region before thermal diffusion, reference signs Lp, Ln, and Lc are each shown in FIG. 1 in order to clarify which regions' dimensions are indicated by Lp, Ln, and Lc (the same applies to FIGS. 13, 20A, 20B, 22A, and 26).

Figure 3:
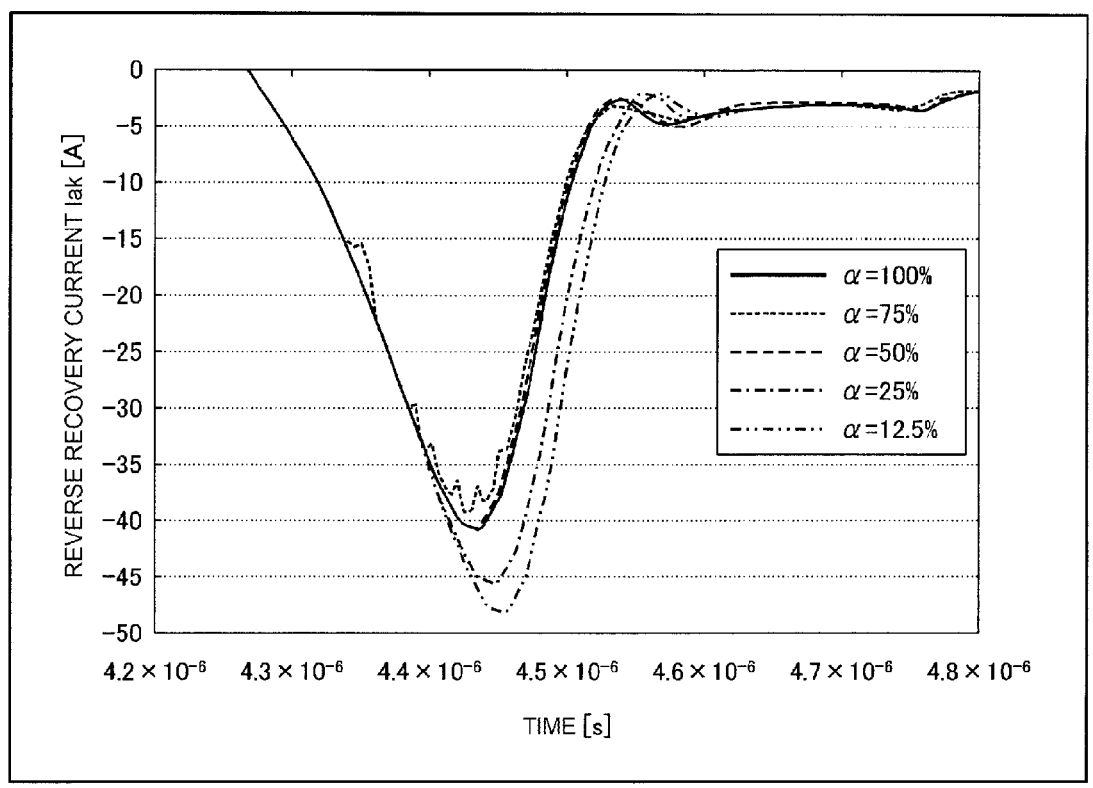
FIG. 3 is a characteristic diagram showing reverse recovery characteristics of the semiconductor device according to Embodiment 1.
Figure 4:
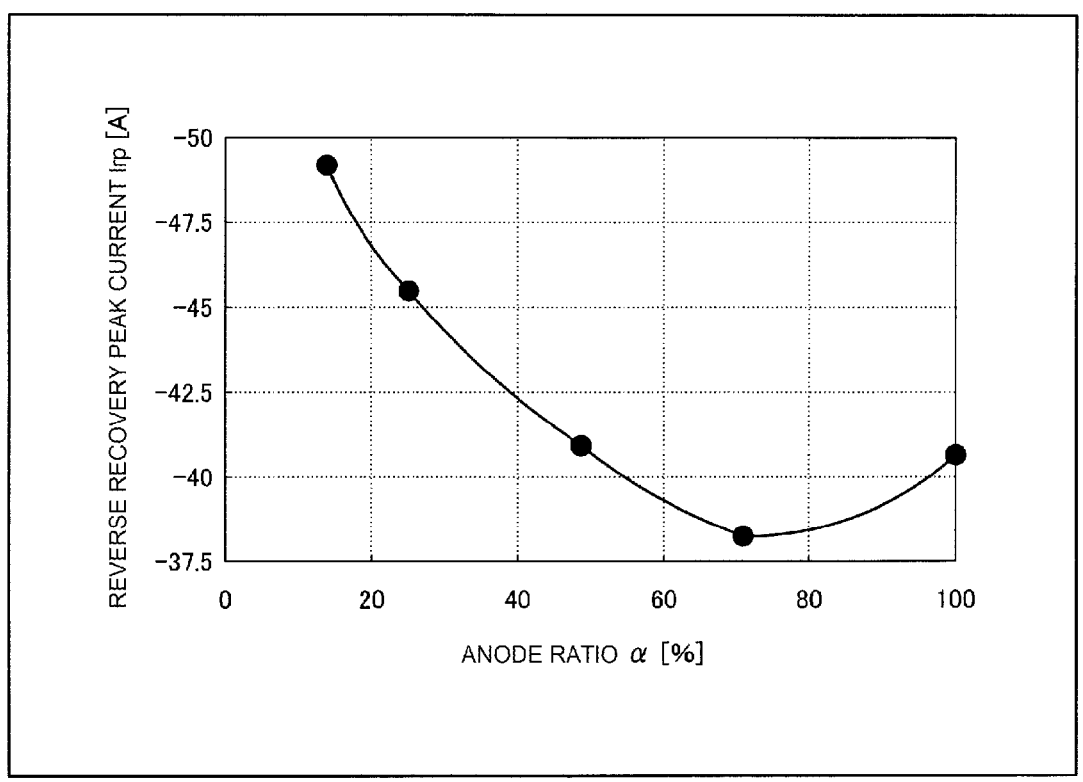
FIG. 4 is a characteristic diagram showing reverse recovery characteristics of the semiconductor device according to Embodiment 1.

Next, the results of verifying the relationship between the anode ratio α and reverse recovery characteristics are shown in FIGS. 3 and 4. FIGS. 3 and 4 are characteristic diagrams showing the reverse recovery characteristics of the semiconductor device according to Embodiment 1. FIG. 3 shows reverse recovery current Iak waveforms. FIG. 4 shows the relationship between the anode ratio α and a reverse recovery peak current (the peak value of the reverse recovery current Iak waveform) Irp. Using simulation technology, the reverse recovery current Iak is calculated in cases wherein the anode ratio α of the semiconductor device according to Embodiment 1 is 12.5%, 25%, 50%, 75%, and 100%.

Specifically, the repetitive pitch of the trench 2 is taken to be 5 μm. The width in the lateral direction of the trench 2 is 1 μm, and the mesa width w20 between trenches 2 is 4 μm. The width (not including an increase caused by thermal diffusion) Lp in the trench 2 longitudinal direction of the p-type anode region 5-2 is taken to be 5 μm. Further, by taking the unit length Lc to be 40 μm (α=12.5%), 20 μm (α=25%), 10 μm (α=50%), approximately 6.7 μm (α=75%), and 5 μm (α=100%), the anode ratio α is changed, and the reverse recovery current Iak calculated. The anode ratio α being 100% is a case wherein the p-type anode region 5-2 is not thinned out, that is, a case wherein the p-type anode region 5-2 is exposed over the whole of the substrate front surface in a mesa portion between neighboring trenches 2 in the FWD portion 22 (the same applies to FIGS. 15 and 16).

From the results shown in FIGS. 3 and 4, it is confirmed that by the anode ratio α being 50% or more and less than 100%, the reverse recovery peak current Irp can be reduced in comparison with when the anode ratio α is 100%. Also, it is confirmed that the reverse recovery peak current Irp can be reduced farthest when the anode ratio α is 75%. Although there are five data points in FIG. 4, conditions between the points have also been evaluated by experiment, and confirmed to indicate the characteristics of the straight lines linking the points.

Generally, when conductive, excess carriers accumulate to or above the doping concentration of the p-type anode region 5-2 in a portion wherein the surface of the n⁻-type drift region 1 is in contact with an oxide film (the interlayer dielectric 8) directly rather than across the p-type anode region 5-2. Therefore, the reverse recovery peak current Irp increases in comparison with when the p-type anode region 5-2 is formed over the whole surface, that is, when the anode ratio α is 100%. As opposed to this, the invention is such that, rather than an increase when the anode ratio α is 50% or more and less than 100%, there is a decrease in comparison with when the anode ratio α is 100%. This is a peculiar advantage not seen in existing diodes.

The following can be considered to be a reason for this. When the anode ratio α is 50% or more and less than 100%, the interval between neighboring p-type anode regions 5-2 in the trench 2 longitudinal direction is smaller than the width of a pn-junction built-in depletion layer. Therefore, built-in depletion layers spreading from each of neighboring p-type anode regions 5-2 are linked with each other in the n⁻-type drift region 1 sandwiched by the built-in depletion layers. As the built-in depletion layer has reverse bias with respect to the pn-junction, holes are not implanted into the n⁻-type drift region 1 to such an extent that the built-in depletion layer is extinguished, even when reverse bias is applied to the pn-junction. That is, the implantation of holes is restricted by the commonly known JFET effect. Therefore, hole implantation efficiency when the anode ratio α is 50% or more and less than 100% decreases in comparison with when the anode ratio α is 100%. Therefore, the carrier concentration distribution in a state wherein a rated current is flowing is such that there is a relative drop on the p-type anode region 5-2 side compared with the n⁺-type cathode region 12 side. The heretofore described series of actions achieves the advantage of reducing the reverse recovery peak current Irp, as shown in FIGS. 3 and 4.

The reason for the reverse recovery peak current Irp increasing when the anode ratio α is less than 50% is that, as the built-in depletion layers spreading into the n⁻-type drift region 1 from the p-type anode region 5-2 on either side are not linked, the JFET effect decreases. Due to the JFET effect decreasing, accumulated carriers directly below the oxide film begin to increase, because of which the reverse recovery peak current Irp increases.

According to the above, it is preferable that the interval between neighboring p-type anode regions 5-2 is of, or less than, a distance such that the built-in depletion layers spreading from each p-type anode region 5-2 link with each other. In this case, the following kind of advantage is further achieved. For example, the width Lp in the trench 2 longitudinal direction of the p-type anode region 5-2 is set to be sufficiently smaller than the mesa width w20 between trenches 2. Therefore, even when the width Lp in the trench 2 longitudinal direction of the p-type anode region 5-2 is small, the interval between neighboring p-type anode regions 5-2 can be of, or less than, a distance such that the built-in depletion layers spreading from each p-type anode region 5-2 link with each other. Therefore, the reverse recovery peak current Irp is further reduced, and the minimum value of the reverse recovery peak current Irp shown in, for example, FIG. 4 can be further reduced. Therefore, the anode ratio α at which the reverse recovery peak current Irp is at a minimum can be between 75% or more (or furthermore, 80% or more) and less than 100%.

Figure 5:
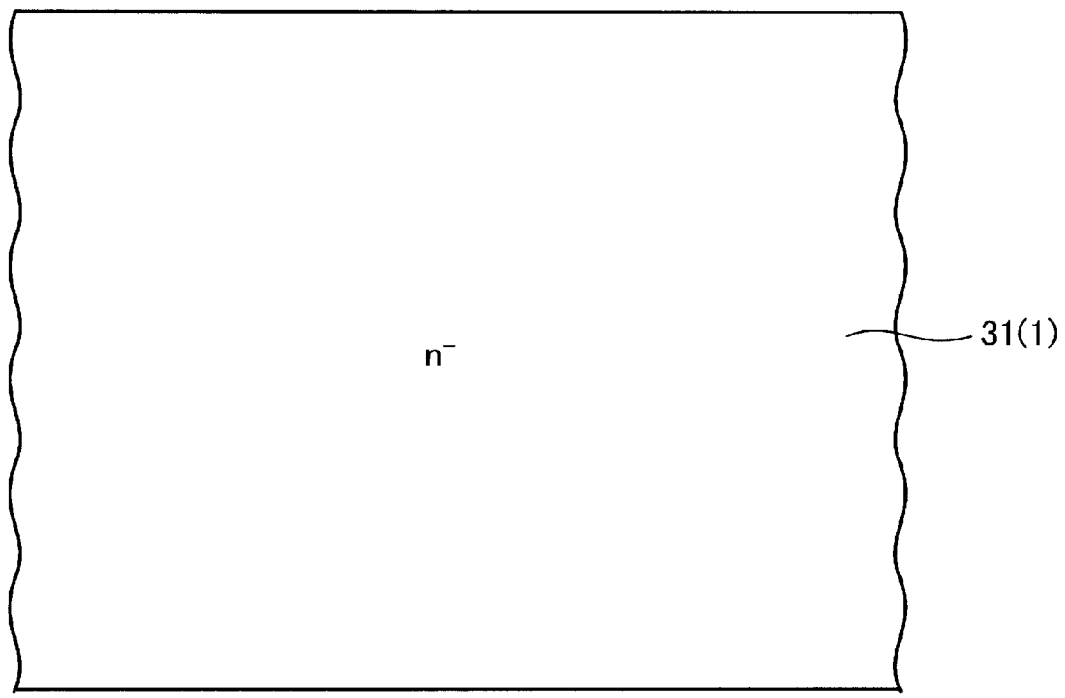
FIG. 5 is a sectional view showing a state partway through the manufacture of the semiconductor device according to Embodiment 1.

Next, a description will be given of a method of manufacturing the semiconductor device according to Embodiment 1, with a case of fabricating (manufacturing) an RC-IGBT of rated voltage 1,200V, rated current 400 A as an example. FIGS. 5 to 8 are sectional views showing states partway through the manufacture of the semiconductor device according to Embodiment 1. FIGS. 9 to 12 are illustrations showing states partway through the manufacture of the semiconductor device according to Embodiment 1. In each of FIGS. 9 to 12, (b) shows a planar structure partway through manufacture, while (a) shows a sectional structure along a B-B' cutting line of (b). Firstly, as shown in FIG. 5, an n⁻-type silicon (Si) substrate (n⁻-type semiconductor substrate) 31 of, for example, 650 μm in thickness and 6 inches in diameter, which is to form the n⁻-type drift region 1, is prepared.

When the rated voltage is 1,200V, the resistivity of the silicon substrate is in the region of, for example, 40 Ωcm to 80 Ωcm. Therefore, the resistivity of the n⁻-type semiconductor substrate 31 may be in the region of, for example, 55 Ωcm. The orientation of the main surface of the silicon substrate is, for example, (100). Next, a p-type guard ring, for example, configuring a voltage withstanding structure is formed on the front surface side of the n⁻-type semiconductor substrate 31 in an edge termination structure portion omitted from the drawings. The edge termination structure portion is a region that relaxes an electrical field exerted on the n⁻-type drift region 1 in an active region, thereby maintaining breakdown voltage. The active region is a region in which an RC-IGBT element structure is formed. In the same way, the edge termination structure portion is also omitted from FIGS. 1, 2, 5 to 14, 17, 20A to 23C, 26, and 27.

Figure 6:
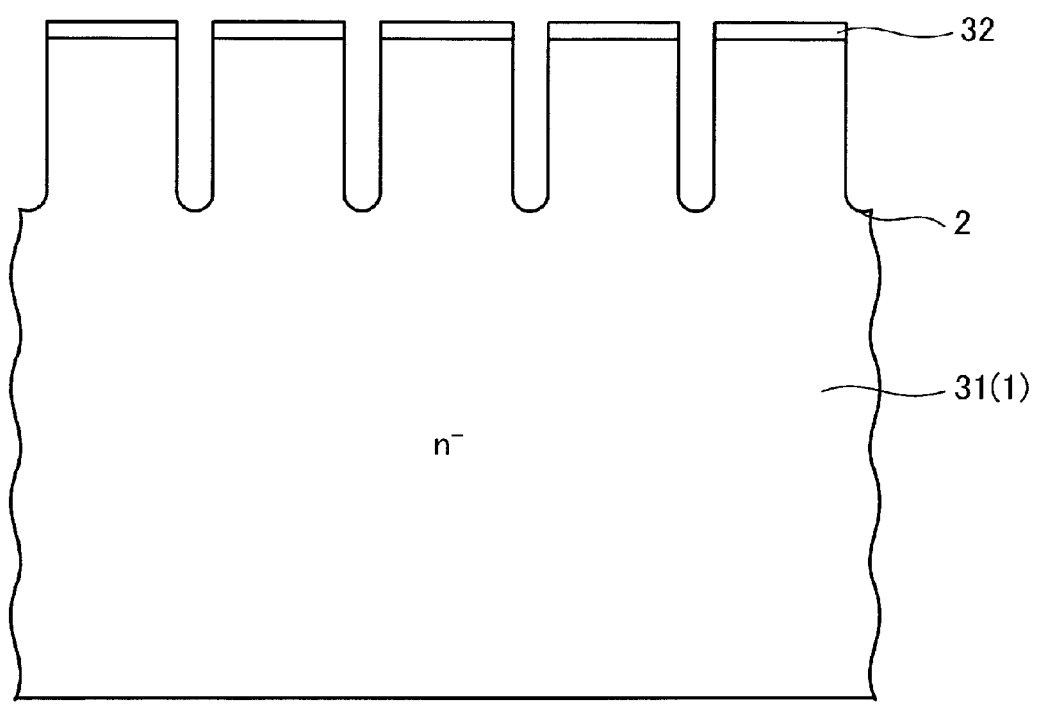
FIG. 6 is a sectional view showing a state partway through the manufacture of the semiconductor device according to Embodiment 1.

Specifically, a resist mask (not shown) in which is opened the formation region of the p-type guard ring is formed on the front surface of the n⁻-type semiconductor substrate 31. Next, with the resist mask as a mask, a p-type impurity such as, for example, boron (B) is ion implanted into the front surface of the n⁻-type semiconductor substrate 31. Next, after the resist mask is removed, the p-type impurity implanted into the n⁻-type semiconductor substrate 31 is caused to diffuse by a thermal diffusion processing, whereby the p-type guard ring is formed. Also, as shown in FIG. 6, an oxide film 32 is formed on the front surface of the n⁻-type semiconductor substrate 31 by the thermal diffusion processing for forming the p-type guard ring.

Next, a portion of the oxide film 32 corresponding to the formation region of the trench 2 is removed by photolithography. Next, with the oxide film 32 as a mask, anisotropic dry etching, for example, is carried out, thereby forming the trench 2 to a predetermined depth in the front surface of the n⁻-type semiconductor substrate 31. Next, a sacrificial oxide film (not shown) is formed on the inner wall of the trench 2 by sacrificial oxidation, and by the sacrificial oxide film being removed, a defect layer created on the n⁻-type semiconductor substrate 31 surface by the formation of the trench 2 is removed. Next, the oxide film 32 covering the front surface of the n⁻-type semiconductor substrate 31 in the active region is removed.

Figure 7:
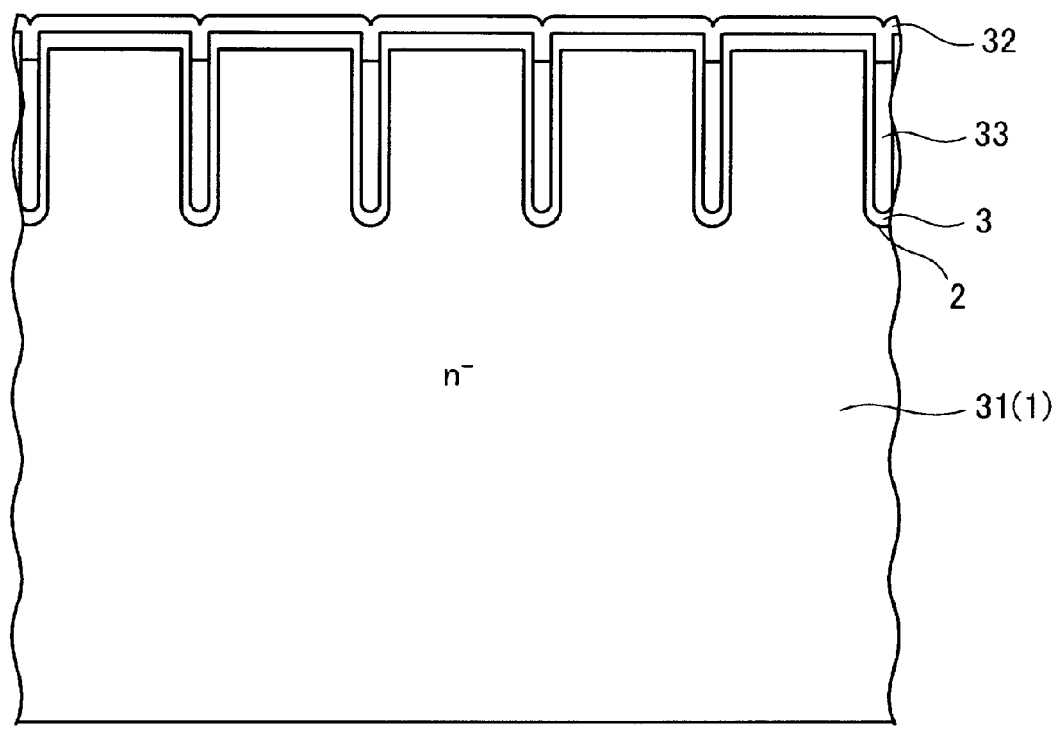
FIG. 7 is a sectional view showing a state partway through the manufacture of the semiconductor device according to Embodiment 1.
Figure 8:
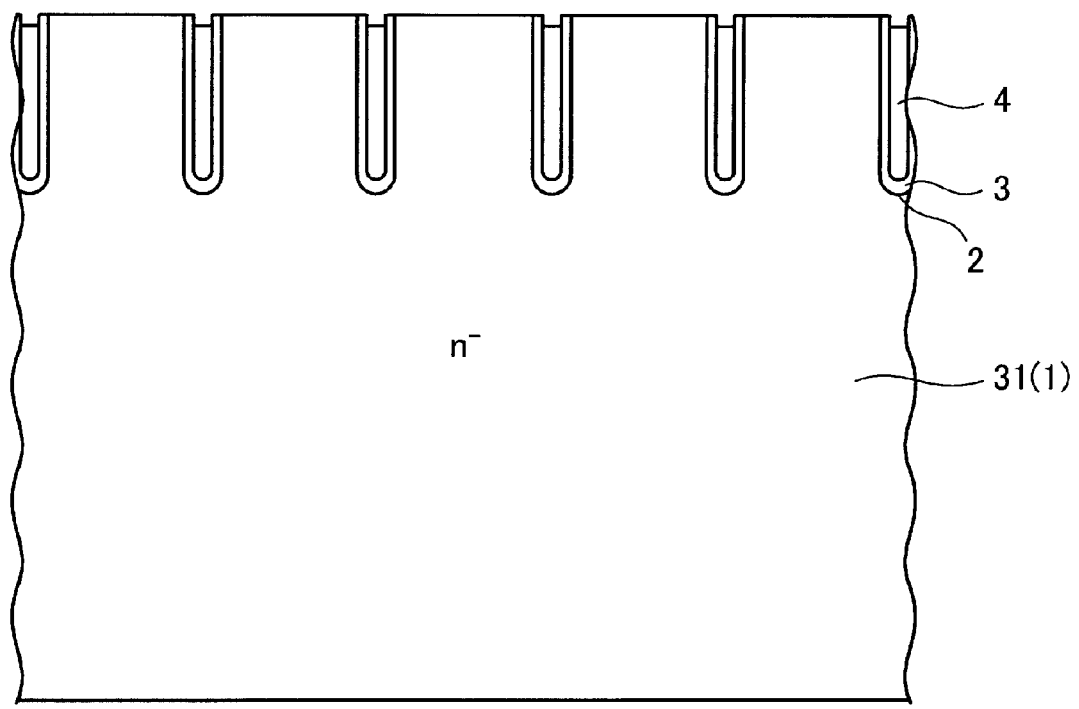
FIG. 8 is a sectional view showing a state partway through the manufacture of the semiconductor device according to Embodiment 1.

Next, as shown in FIG. 7, the gate insulating film 3 is formed by thermal oxidation on the front surface of the n⁻-type semiconductor substrate 31 so as to follow the inner wall of the trench 2. The thickness of the gate insulating film 3 is, for example, 100 nm to 120 nm, and in Embodiment 1 is, for example, 110 nm. Next, a conductive polycrystalline silicon film 33 is deposited on the front surface of the n⁻-type semiconductor substrate 31, thereby filling the interior of the trench 2. Next, as shown in FIG. 8, the conductive polycrystalline silicon film 33 is etched back until the gate insulating film 3 is exposed, leaving the conductive polycrystalline silicon film 33, which is to form the gate electrode 4, in only the interior of the trench 2. Next, the gate insulating film 3 and oxide film 32 on the front surface of the n⁻-type semiconductor substrate 31 are removed.

Figure 9:
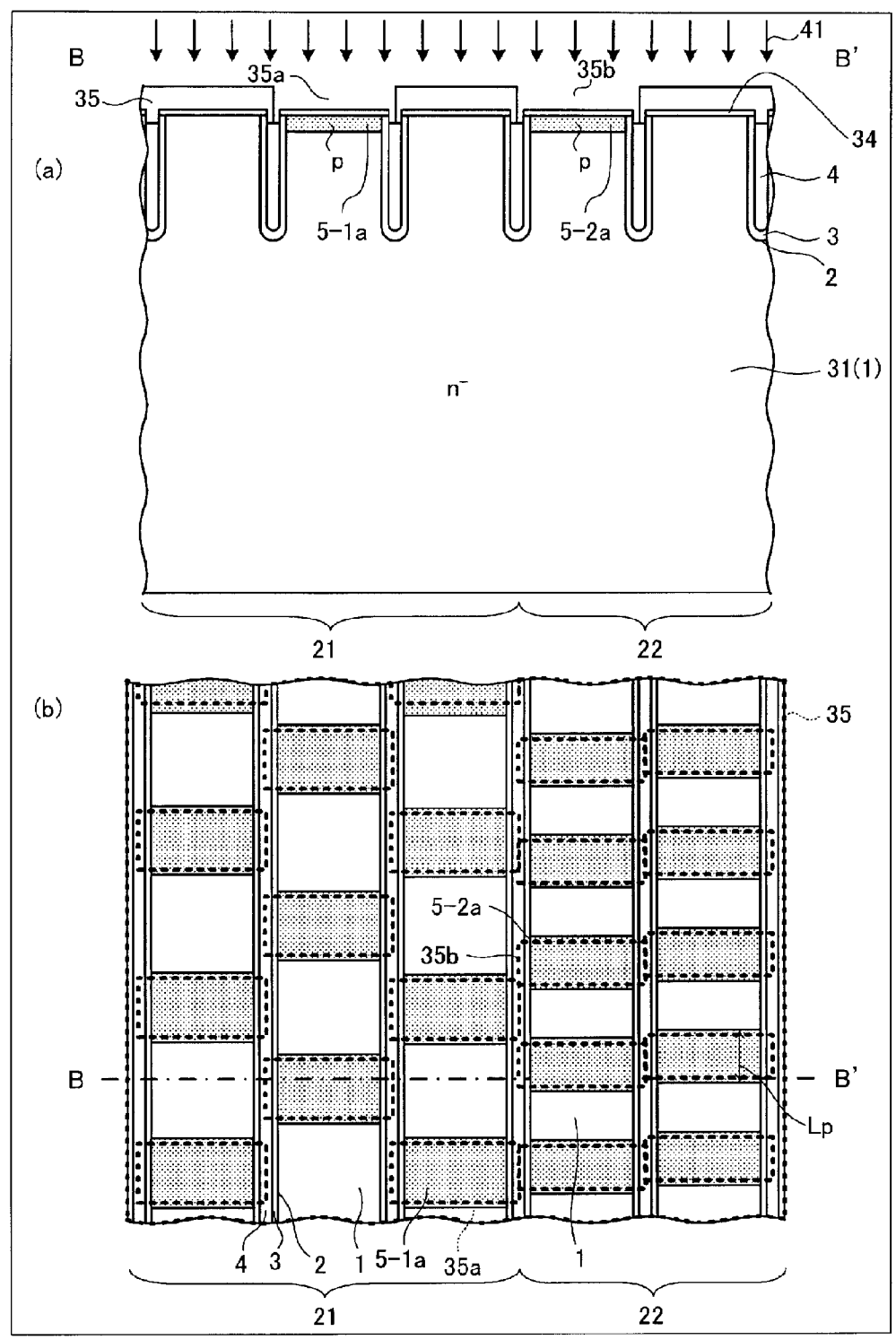
FIG. 9 is an illustration showing a state partway through the manufacture of the semiconductor device according to Embodiment 1.

Next, as shown in FIG. 9, a screen oxide film 34 is formed on the front surface of the n⁻-type semiconductor substrate 31 using a thermal oxidation method. The screen oxide film 34 is omitted from FIG. 9(b) (the same also applies to (b) in FIGS. 10 to 12). Next, a resist mask 35 having a first aperture portion 35a that exposes the formation region of the p-type base region 5-1 and a second aperture portion 35b that exposes the formation region of the p-type anode region 5-2 is formed by photolithography on the front surface of the n⁻-type semiconductor substrate 31. The width Lp in the trench 2 longitudinal direction of the second aperture portion 35b of the resist mask 35 is set so that the anode ratio α expressed in Expression (1) is within a range of 50% to 75%.

Next, with the resist mask 35 as a mask, a first ion implantation 41 of a p-type impurity such as, for example, boron is carried out through the screen oxide film 34 into the front surface of the n⁻-type semiconductor substrate 31. P-type impurity regions 5-1a and 5-2a are formed by the first ion implantation 41 in the n⁻-type drift region 1 exposed in the first and second aperture portions 35a and 35b of the resist mask 35. Subsequently, the resist mask 35 is removed. At this time, when the p-type base region 5-1 of the IGBT portion 21 and p-type anode region 5-2 of the FWD portion 22 are to be formed to have differing impurity concentrations, it is sufficient to form a further resist mask and carry out a further p-type impurity ion implantation.

Specifically, when the p-type base region 5-1 and p-type anode region 5-2 are to be formed to have differing impurity concentrations, for example, a resist mask in which only the formation region of the p-type base region 5-1 in the region of the IGBT portion 21 is selectively opened is formed first. Next, with this resist mask as a mask, an ion implantation of, for example, boron is carried out at a dose of in the region of $2 \times 10^{13}/cm^2$ and an acceleration energy of in the region of 100 keV, after which the resist mask is removed. Next, a resist mask in which only the formation region of the p-type anode region 5-2 in the region of the FWD portion 22 is selectively opened is formed. Then, it is sufficient that, with this resist mask as a mask, an ion implantation of, for example, boron is carried out at a dose within a range of in the region of $1 \times 10^{12}/cm^2$ or more, $1 \times 10^{13}/cm^2$ or less, and at an acceleration energy of in the region of 100 keV, after which the resist mask is removed.

Figure 10:
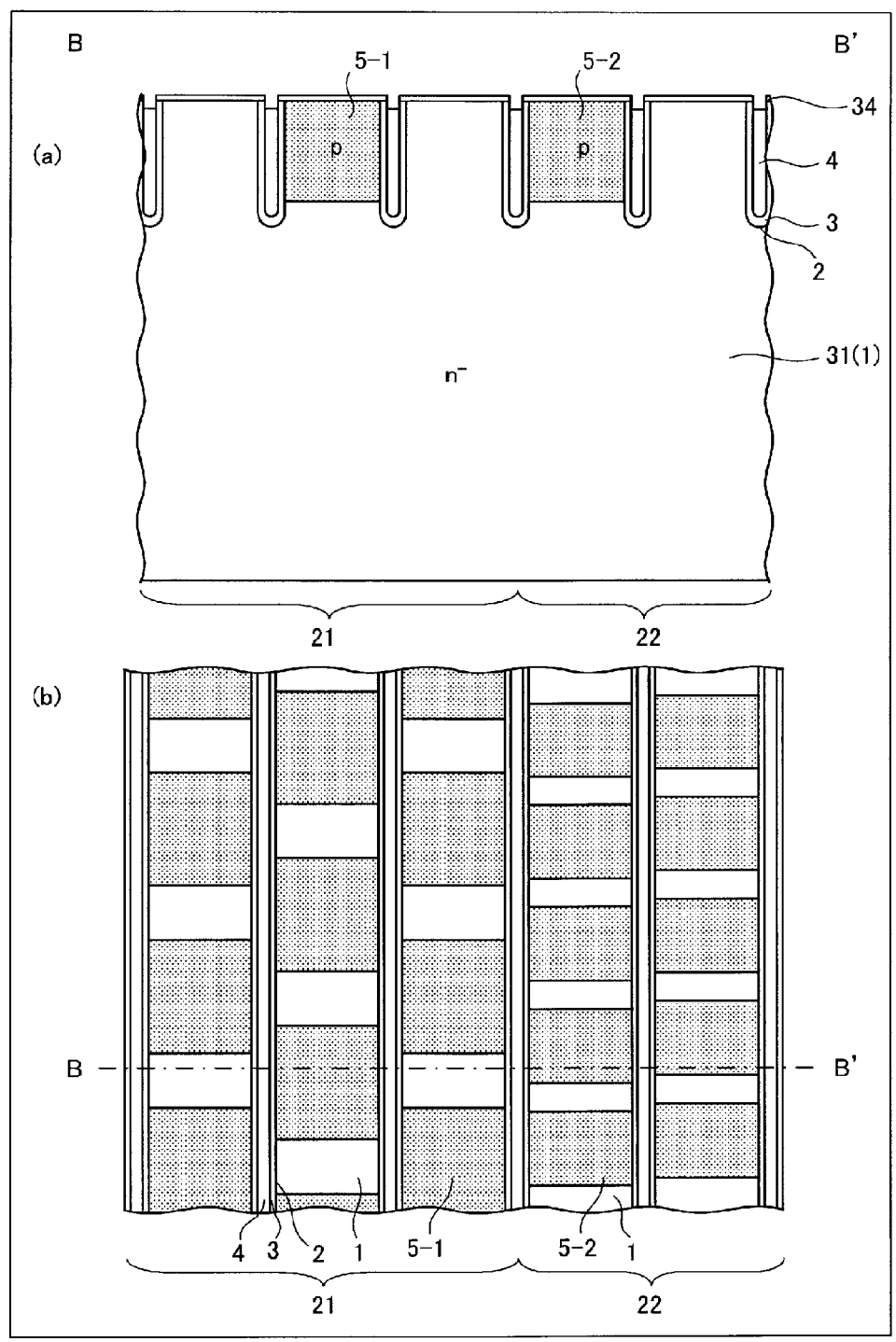
FIG. 10 is an illustration showing a state partway through the manufacture of the semiconductor device according to Embodiment 1.

Next, as shown in FIG. 10, a thermal diffusion processing is carried out at a temperature within a range of in the region of 1,050° C. or more, 1,150° C. or less, thereby forming the p-type base region 5-1, formed by the p-type impurity region 5-1a being thermally diffused, and the p-type anode region 5-2, formed by the p-type impurity region 5-2a being thermally diffused. Owing to the heretofore described processing, the gate threshold of the semiconductor device is approximately 6V.

Figure 11:
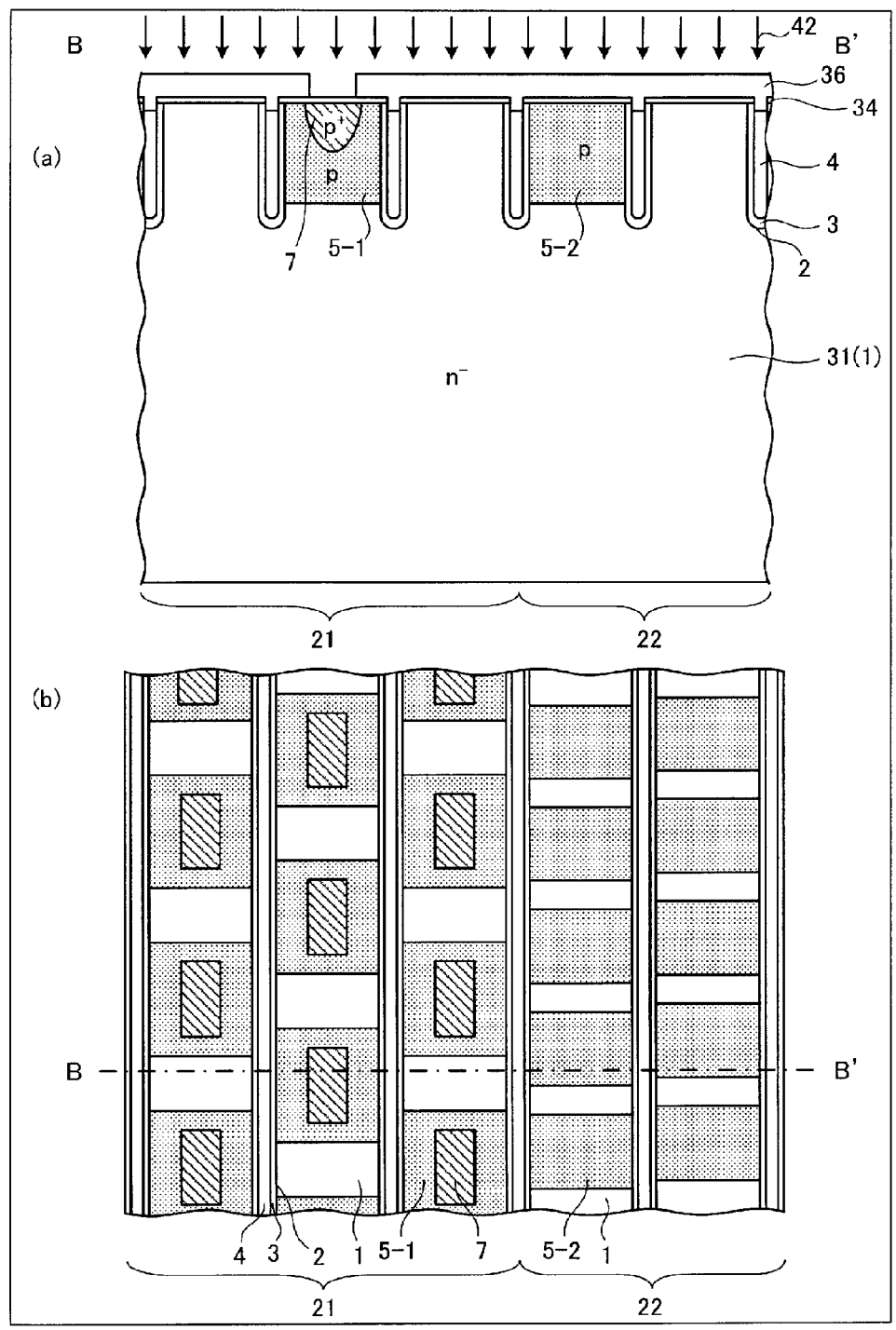
FIG. 11 is an illustration showing a state partway through the manufacture of the semiconductor device according to Embodiment 1.

Next, as shown in FIG. 11, a resist mask 36 having an aperture portion that exposes the formation region of the p⁺-type contact region 7 is formed by photolithography on the front surface of the n⁻-type semiconductor substrate 31. The aperture portion of the resist mask 36 is in only the region of the IGBT portion 21, and is not formed in the FWD portion 22. Next, with the resist mask 36 as a mask, a second ion implantation 42 of a p-type impurity such as, for example, boron is carried out through the screen oxide film 34 into the front surface of the n⁻-type semiconductor substrate 31. For example, the dose of the ion implantation may be within a range of in the region of, for example, $1 \times 10^{15}/cm^2$ or more, $5 \times 10^{15}/cm^2$ or less, and the acceleration energy may be in the region of 100 keV. Next, after removing the resist mask 36, the p⁺-type contact region 7 is formed inside the p-type base region 5-1, only in the IGBT portion 21, by thermally diffusing the p-type impurity implanted by the second ion implantation 42 at a temperature in the region of, for example, 1,000° C. The resist mask 36 is omitted from FIG. 11(b).

Figure 12:
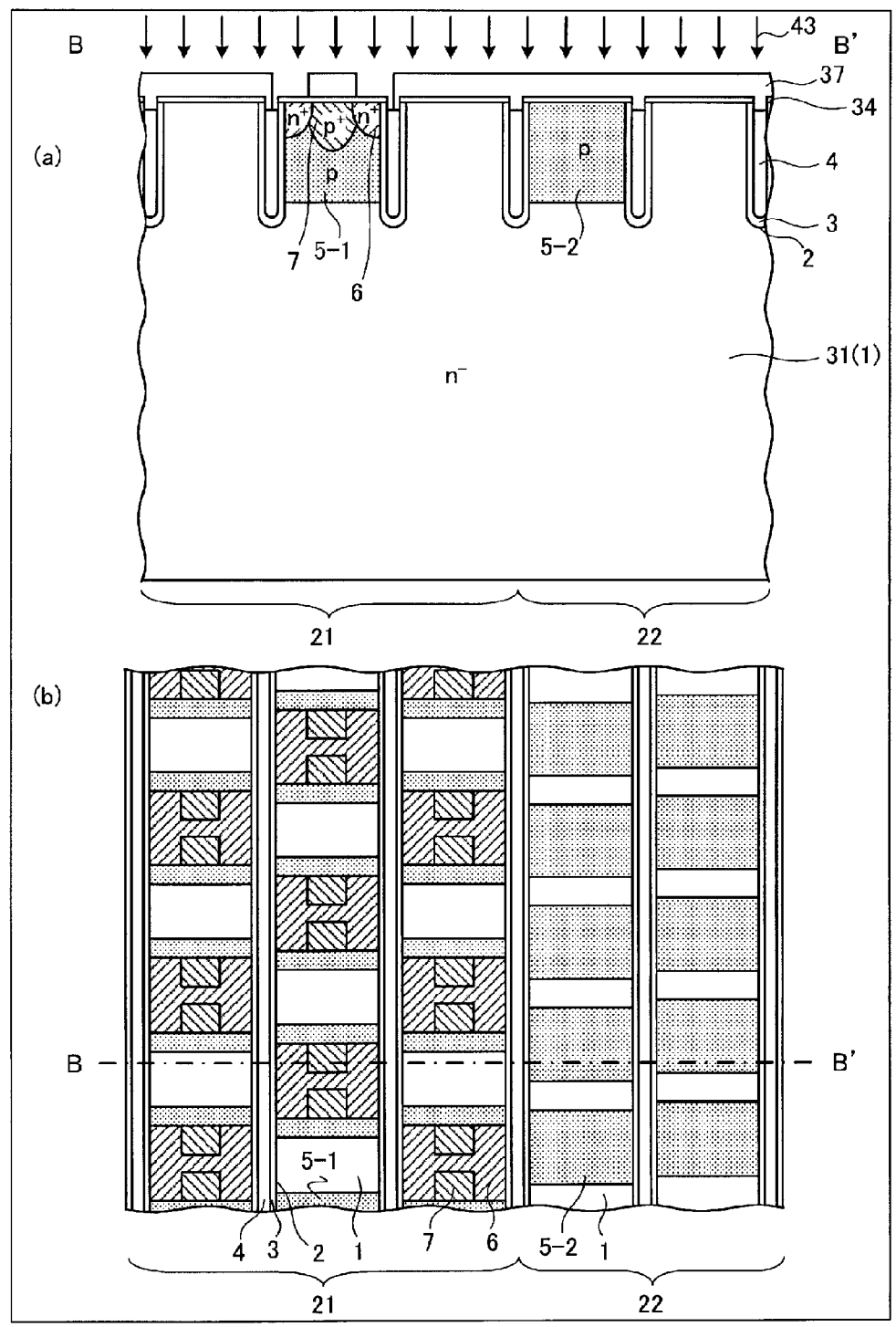
FIG. 12 is an illustration showing a state partway through the manufacture of the semiconductor device according to Embodiment 1.

Next, as shown in FIG. 12, a resist mask 37 having an aperture portion that exposes the formation region of the n⁺-type emitter region 6 is formed by photolithography on the front surface of the n⁻-type semiconductor substrate 31. Next, with the resist mask 37 as a mask, a third ion implantation 43 of an n-type impurity such as, for example, arsenic (As) is carried out through the screen oxide film 34 into the front surface of the n⁻-type semiconductor substrate 31. Next, after removing the resist mask 37, the n⁺-type emitter region 6 is formed inside the p-type base region 5-1 by thermally diffusing the n-type impurity implanted by the third ion implantation 43. The resist mask 37 is omitted from FIG. 12(*b*).

Next, the interlayer dielectric 8, of BPSG (borophosphosilicate glass) or the like, is formed over the whole of the front surface of the n⁻-type semiconductor substrate 31. Next, the interlayer dielectric 8 is selectively removed by photolithography, thereby forming the first and second contact holes 8-1 and 8-2. Next, after the emitter electrode 9 is formed on the front surface of the n⁻-type semiconductor substrate 31 using a general method, the front surface of the n⁻-type semiconductor substrate 31 is protected with, for example, a resist film (not shown). Next, after the back surface of the n⁻-type semiconductor substrate 31 is ground, thereby reducing the thickness of the n⁻-type semiconductor substrate 31 to, for example, 125 µm, a grinding strain layer is removed by etching.

Next, a fourth ion implantation of an n-type impurity such as, for example, selenium (Se) is carried out from the back surface of the n⁻-type semiconductor substrate 31. The fourth ion implantation is an ion implantation for forming the n-type buffer layer 10, and may be carried out at, for example, a dose of in the region of $3\times10^{14}/cm^2$ and an acceleration energy of in the region of 100 keV. A fifth ion implantation of a p-type impurity such as, for example, boron is carried out from the back surface of the n⁻-type semiconductor substrate 31 into a region shallower than the fourth ion implantation. The fifth ion implantation is an ion implantation for forming the p⁺-type collector region 11, and may be carried out at, for example, a dose of in the region of $8\times10^{13}/cm^2$ and an acceleration energy of in the region of 40 keV.

Next, a resist mask (not shown) of a thickness in the region of, for example, 2 µm and having an aperture portion that exposes the formation region of the n⁺-type cathode region 12, that is, the FWD portion 22, is formed by photolithography on the back surface of the n⁻-type semiconductor substrate 31. Next, with the resist mask as a mask, a sixth ion implantation of an n-type impurity such as, for example, phosphorus (P) is carried out into the back surface of the n⁻-type semiconductor substrate 31. The sixth ion implantation may be carried out at, for example, a dose of in the region of $2\times10^{15}/cm^2$ and an acceleration energy of in the region of 110 keV.

Next, the resist mask protecting the front surface of the n⁻-type semiconductor substrate 31 and the resist mask on the back surface of the n⁻-type semiconductor substrate 31 are removed. Next, the impurity regions formed by the fourth to sixth ion implantations are activated by carrying out a thermal processing for in the region of 30 minutes at a temperature in the region of, for example, 950° C. Next, an aluminum-silicon (Al—Si, for example, Al including 1% Si) film of a thickness in the region of, for example, 5 µm is formed on the front surface side of the n⁻-type semiconductor substrate 31. Then, the emitter electrode 9 is formed by patterning the Al—Si film.

Next, an irradiation with, for example, helium (4He) is carried out from the back surface of the n⁻-type semiconductor substrate 31 at an acceleration energy of in the region of 23 MeV and a dose of in the region of $1\times10^{13}/cm^2$. Next, an annealing (thermal processing) is carried out for in the region of one hour at a temperature in the region of 370° C., thereby causing recovery of defects occurring inside the n⁻-type semiconductor substrate 31 due to the helium irradiation. Subsequently, the collector electrode 13 is formed by an Al film, Ti film, Ni film, and gold (Au) film being deposited sequentially to thicknesses of in the region of 1 µm, 0.07 µm, 1 µm, and 0.3 µm respectively on the back surface of the n⁻-type semiconductor substrate 31, thereby completing the RC-IGBT shown in FIGS. 1 and 2.

As heretofore described, according to Embodiment 1, reverse recovery current can be reduced, and reverse recovery loss can thereby be reduced, by adopting an anode ratio of 50% to 75%, because of which the diode characteristics can be improved. Also, according to Embodiment 1, no Schottky junction of the emitter electrode and n⁻-type drift region is formed in the FWD portion, because of which leakage current can be prevented from increasing when in an off-state. Also, according to Embodiment 1, the region in which only the IGBT is provided (the IGBT portion) can be secured over a greater area than in PTL 2 by the IGBT portion and FWD portion being disposed separately. Therefore, even when carriers are extracted from the FWD portion, the carrier concentration in the IGBT portion can be maintained at a high level. Therefore, the on-state resistance can be reduced, and the on-state voltage can thereby be reduced.

(Embodiment 2)

Figure 13:
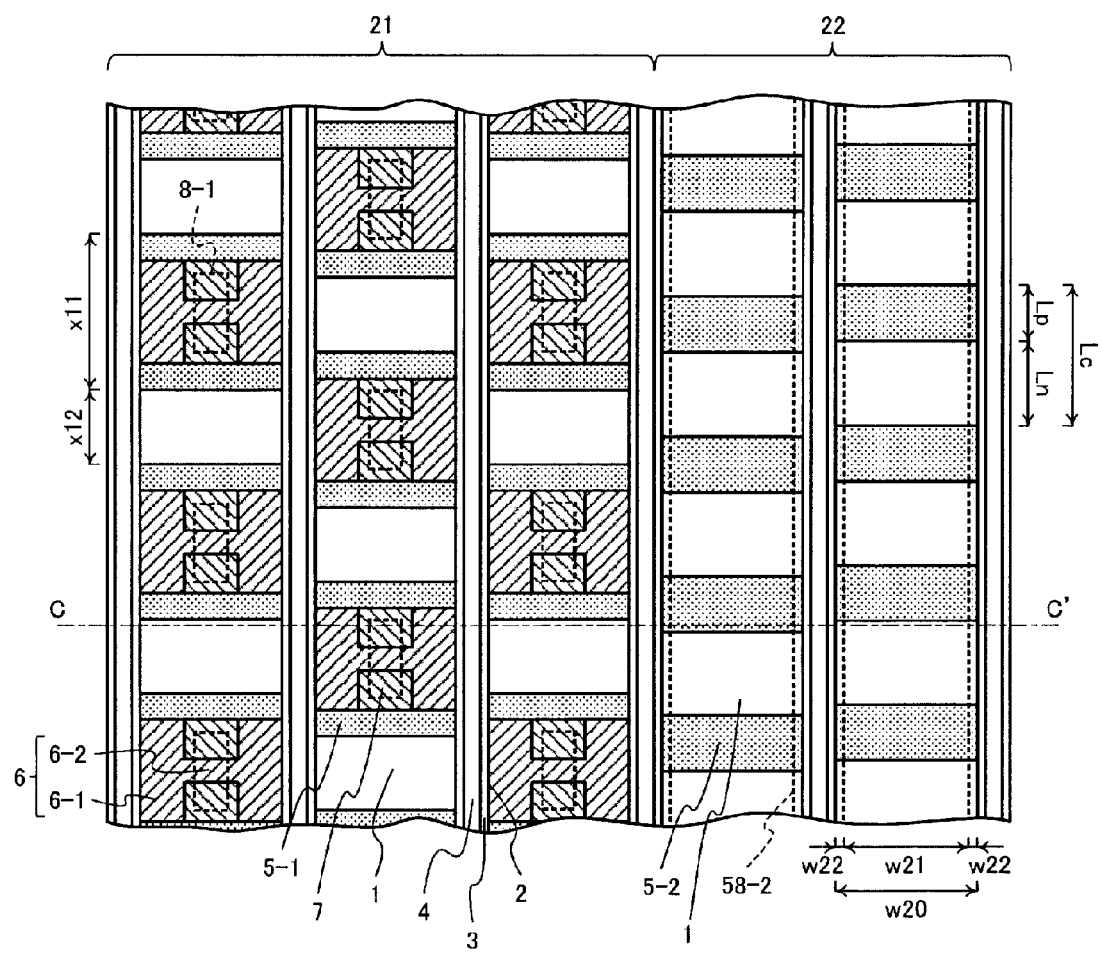
FIG. 13 is a plan view showing the structure of a semiconductor device according to Embodiment 2.
Figure 14:
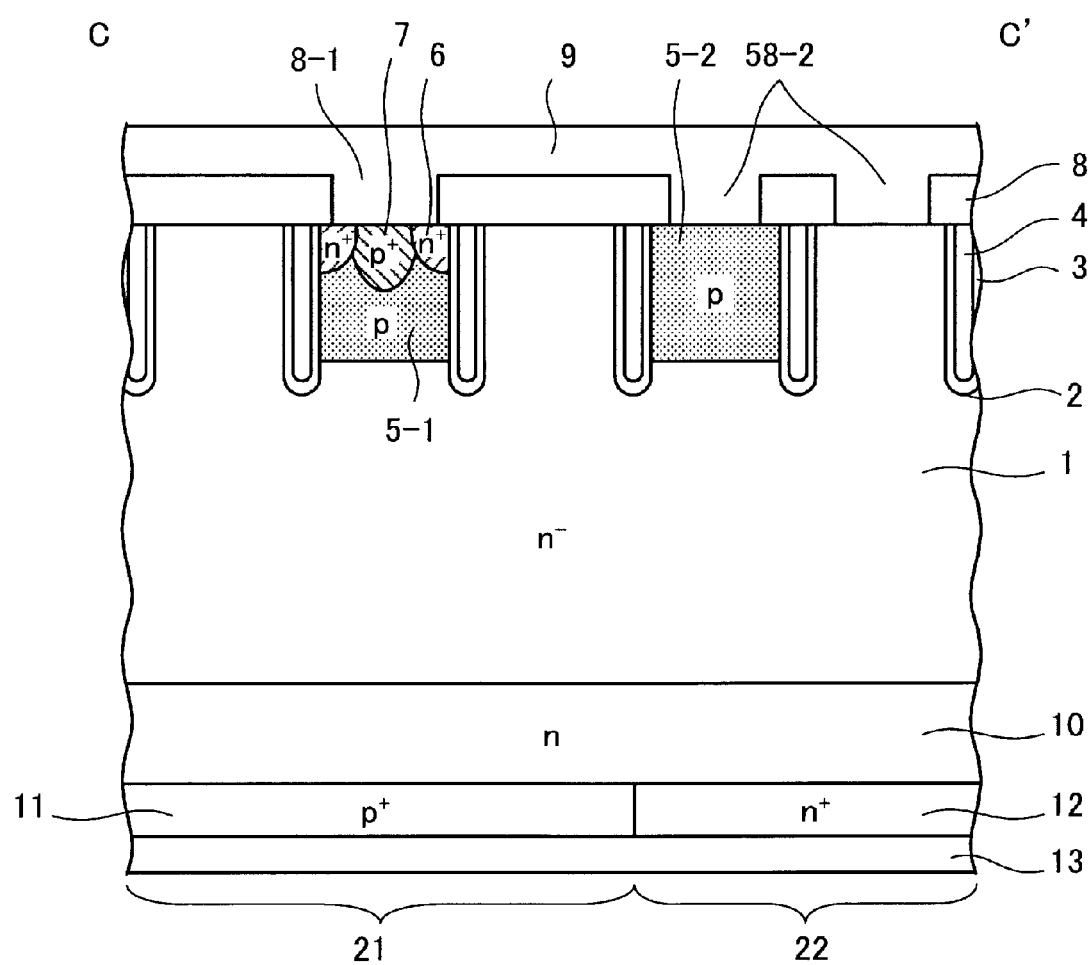
FIG. 14 is a sectional view showing the sectional structure along a cutting line C-C' of FIG. 13.

Next, a description will be given of the configuration of a semiconductor device according to Embodiment 2. FIG. 13 is a plan view showing the structure of the semiconductor device according to Embodiment 2. FIG. 14 is a sectional view showing the sectional structure along a cutting line C-C' of FIG. 13. The semiconductor device according to Embodiment 2 differs from the semiconductor device according to Embodiment 1 in the following two ways. The first difference is that practically the whole of a mesa portion between neighboring trenches 2 in the FWD portion 22 is exposed in a second contact hole 58-2, and both the p-type anode region 5-2 and n⁻-type drift region 1 are connected to the emitter electrode 9.

That is, a Schottky junction of the n⁻-type drift region 1 and emitter electrode 9 is formed in the FWD portion 22. It is preferable that a material such as, for example, Al including 1% Si, platinum (Pt), or platinum silicide (PtSi), wherein a height $\Delta\phi_B$ of a Schottky barrier at an interface with a silicon portion is 0.8 eV or more, is used as the material configuring at least the portion of the emitter electrode 9 in contact with the silicon portion of the FWD portion 22. By so doing, leakage current can be reduced. This is effective when providing a barrier metal between the emitter electrode 9 and the silicon portion in the IGBT portion 21 for size reduction or the like.

Figure 15:
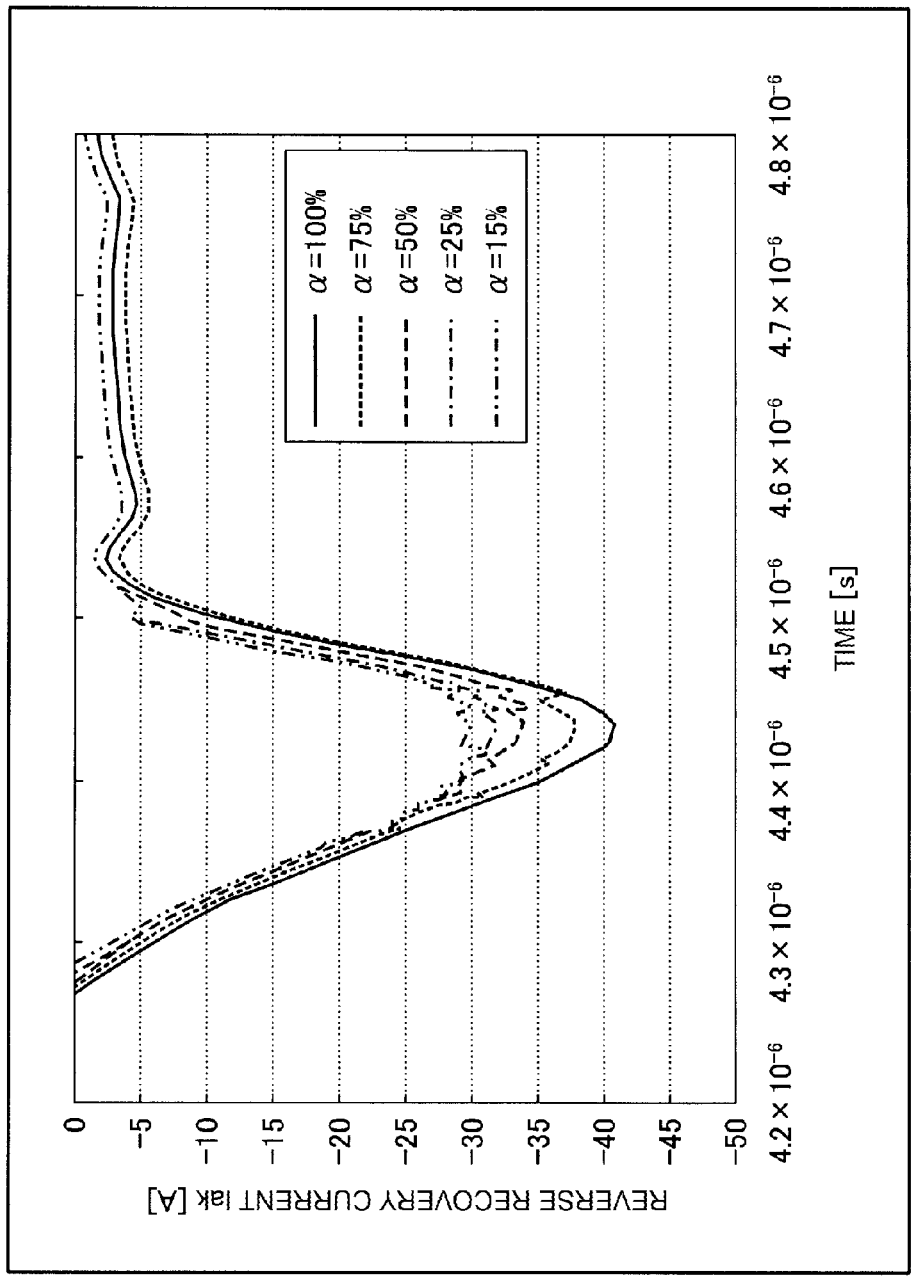
FIG. 15 is a characteristic diagram showing reverse recovery characteristics of the semiconductor device according to Embodiment 2.
Figure 16:
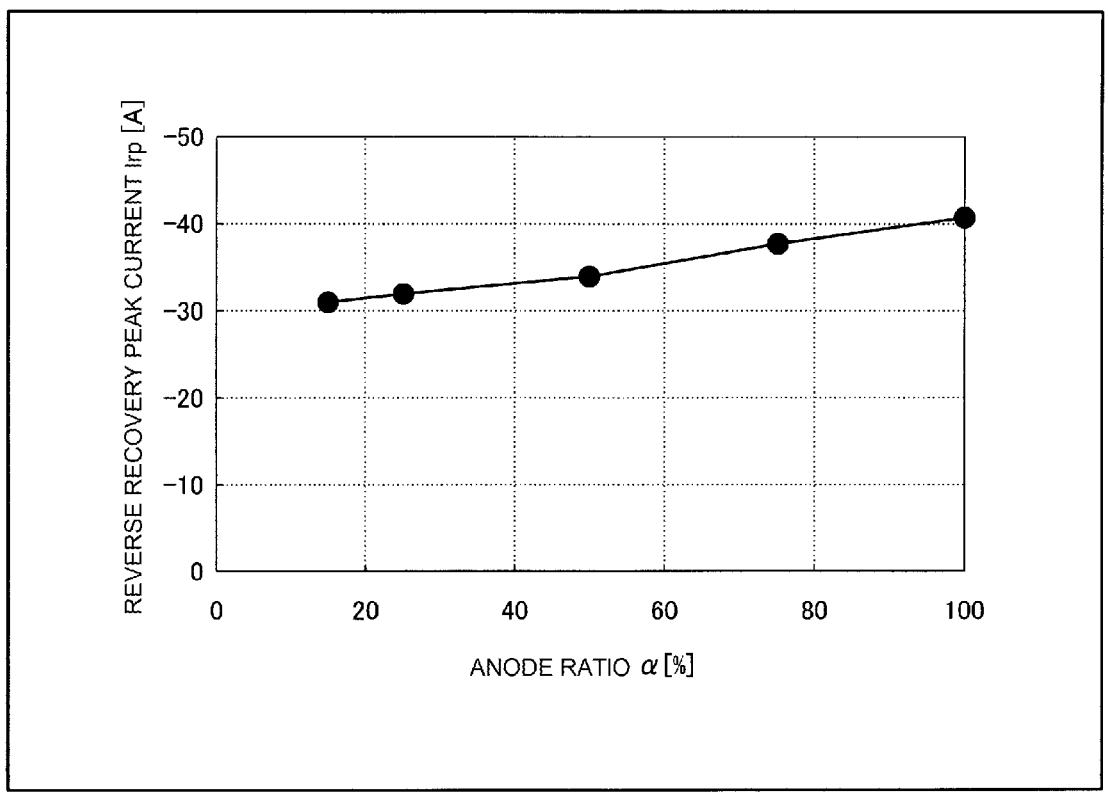
FIG. 16 is a characteristic diagram showing reverse recovery characteristics of the semiconductor device according to Embodiment 2.

The second difference is that the lower the anode ratio α the better (α≠0%), and it is good when the anode ratio α is, for example, less than 50%, preferably 25% or less. The reason for this is that the lower the anode ratio α, the farther the recovery peak current Irp can be reduced. The results of verifying the relationship between the anode ratio α and reverse recovery characteristics are shown in FIGS. 15 and 16. FIGS. 15 and 16 are characteristic diagrams showing the reverse recovery characteristics of the semiconductor device according to Embodiment 2. FIG. 15 shows the reverse recovery current Iak waveforms. FIG. 16 shows the relationship between the anode ratio α and the reverse recovery peak current Irp.

Using simulation technology, the reverse recovery current Iak is calculated in cases wherein the anode ratio α of the semiconductor device according to Embodiment 2 is 15%, 25%, 50%, 75%, and 100%. Specifically, the width (not including an increase caused by thermal diffusion) Lp in the trench 2 longitudinal direction of the p-type anode region 5-2 is taken to be 5 μm. Further, by taking the unit length Lc to be approximately 33 μm (α=15%), 20 μm (α=25%), 10 μm (α=50%), approximately 6.7 μm (α=75%), and 5 μm (α=100%), the anode ratio α is changed, and the reverse recovery current Iak calculated.

From the results shown in FIGS. 15 and 16, it is confirmed that the lower the anode ratio α, the farther the reverse recovery peak current Irp can be reduced in comparison with when the anode ratio α is 100%.

Regarding a method of manufacturing the semiconductor device according to Embodiment 2, it is sufficient that disposition of the p-type anode region 5-2 so that the anode ratio α decreases, and formation of the second contact hole 58-2 so that practically the whole of a mesa portion between neighboring trenches 2 in the FWD portion 22 is exposed, are incorporated in the method of manufacturing the semiconductor device according to Embodiment 1. Apart from these two points, the method of manufacturing the semiconductor device according to Embodiment 2 is the same as the method of manufacturing the semiconductor device according to Embodiment 1.

Figure 24:
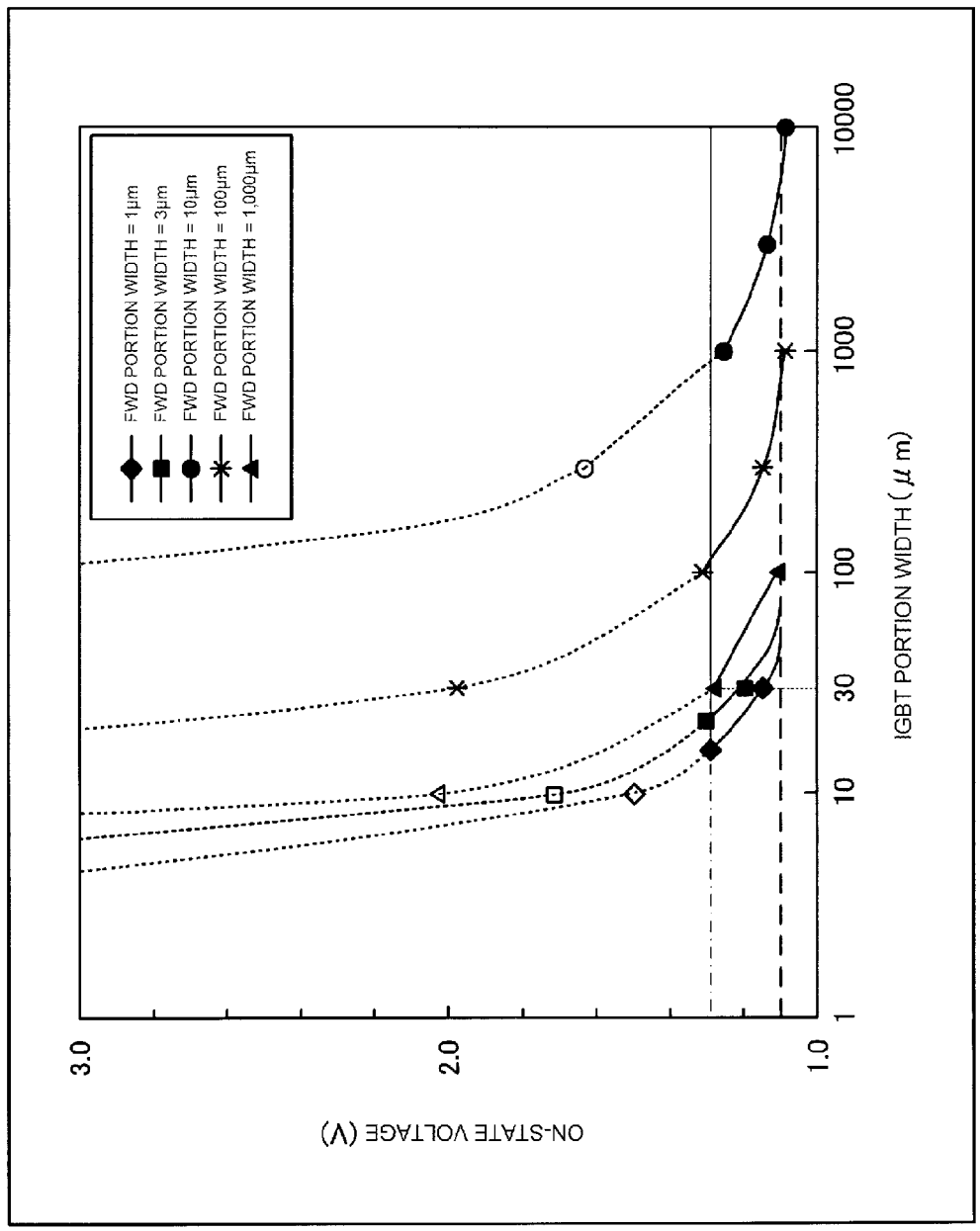
FIG. 24 is a characteristic diagram showing the relationship between the width of an IGBT portion and the width of a FWD portion in the semiconductor device according to Embodiment 2.
Figure 25:
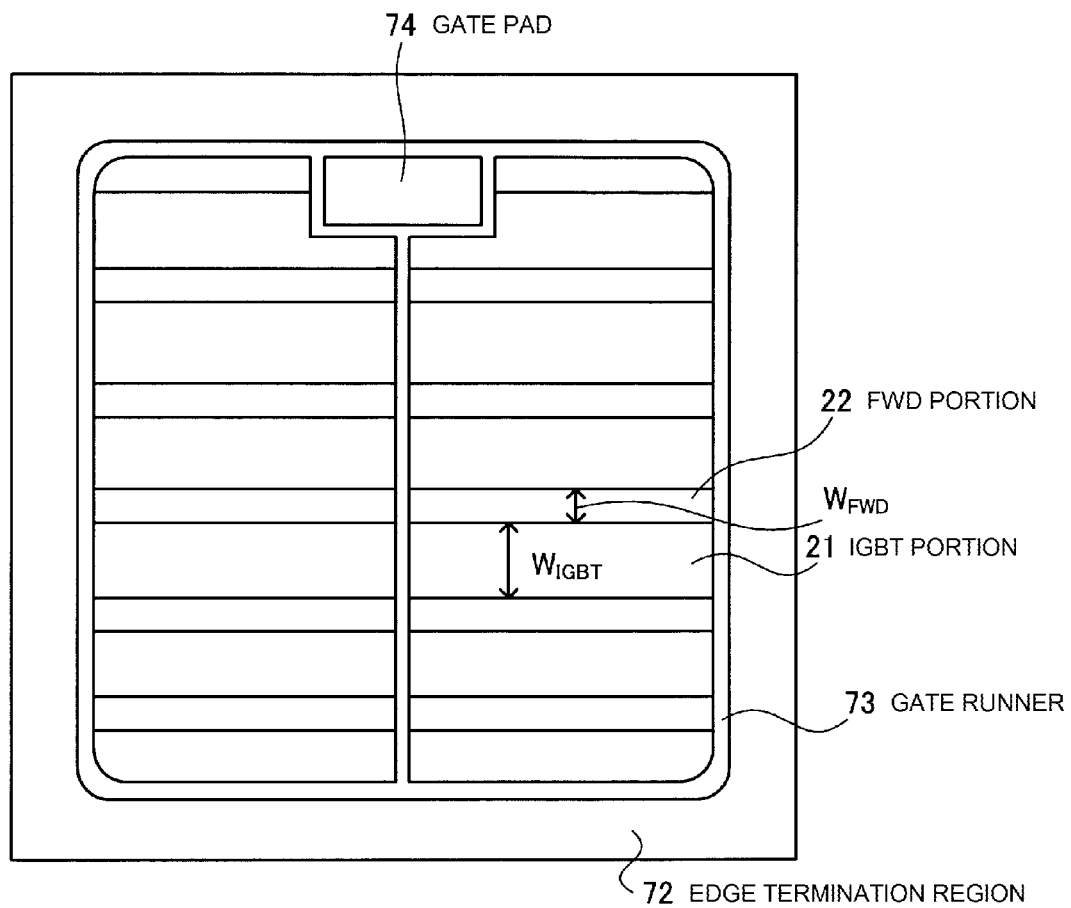
FIG. 25 is a plan view showing the planar configuration of the semiconductor device in Embodiment 2.

Next, a description will be given of preferable widths of the IGBT portion 21 and FWD portion 22. FIG. 24 is a characteristic diagram showing the relationship between the width of the IGBT portion and the width of the FWD portion in the semiconductor device according to Embodiment 2. FIG. 25 is a plan view showing the planar configuration of the semiconductor device in Embodiment 2. As shown in FIG. 25, an edge termination region 72 is formed so as to enclose the active region in an outer peripheral portion of the chip of the reverse conducting IGBT formed of the IGBT portion 21 and FWD portion 22. A gate runner 73 is formed along an outer peripheral portion of the active region and so as to be enclosed by the edge termination region 72. The gate runner 73 is a wire for supplying a gate signal from a gate pad 74 to the IGBT cell inside the active region. The IGBT portion 21 and FWD portion 22, of predetermined sizes, are repeatedly, alternately disposed in a region (a region on the inner side of the active region) surrounded by the gate runner 73. By a multiple of the IGBT portion 21 and FWD portion 22 being repeatedly, alternately disposed in this way, current is evenly dispersed over the whole of the chip, both when the IGBT portion 21 is in an on-state and when the FWD portion 22 is conducting in reverse.

A width $W_{IGBT}$ of the IGBT portion 21 is taken to be the length between neighboring FWD portions 22 in the direction in which the IGBT portion 21 and FWD portion 22 are repeatedly, alternately disposed. That is, the shorter width of the IGBT portion 21, which has, for example, an approximately rectangular planar form, is taken to be $W_{IGBT}$. In the same way, a width $W_{FWD}$ of the FWD portion 22 is taken to be the length between neighboring IGBT portions 21 in the direction in which the IGBT portion 21 and FWD portion 22 are repeatedly, alternately disposed. That is, the shorter width of the FWD portion 22, which has, for example, an approximately rectangular planar form, is taken to be $W_{FWD}$. Regarding the width $W_{IGBT}$ of the IGBT portion 21 and width $W_{FWD}$ of the FWD portion 22, FIG. 24 shows a graph showing on-state voltage when the current density is 400 A/cm² and the temperature is 125° C. FIG. 24 shows the on-state voltage when the width $W_{FWD}$ of the FWD portion 22 is 1 μm, 3 μm, 10 μm, 100 μm, and 1,000 μm by approximate curves linking a multiple of data points. In FIG. 24, the vertical axis is on-state voltage, while the horizontal axis is the IGBT portion width $W_{IGBT}$. Herein, the on-state voltage when the whole of the region surrounded by the gate runner 73 is the IGBT portion (that is, the FWD portion is not provided) is 1.1V, and the position of on-state voltage=1.1V is indicated by the thickest broken line (horizontal line) in FIG. 24.

As shown in FIG. 24, the on-state voltage increases on the width $W_{IGBT}$ of the IGBT portion 21 becoming less than a certain width at each width $W_{FWD}$ of the FWD portion 22. In particular, it is clear that at every width $W_{FWD}$ of the FWD portion 22, the on-state voltage increases sharply in response to a reduction in the width $W_{IGBT}$ of the IGBT portion 21 when the on-state voltage is 1.3V or higher. In FIG. 24, the position of on-state voltage=1.3V is indicated by a solid line (the horizontal line to the right of the data point when the width $W_{FWD}$ of the FWD portion 22 is 1 μm), and approximate curves of portions wherein the on-state voltage is greater than 1.3V are shown by dotted lines (when the width $W_{FWD}$ of the FWD portion 22 is 1 μm, 3 μm, 10 μm, or 1,000 μm, data points at which the on-state voltage is greater than 1.3V are shown as blank reference signs). The on-state voltage being 1.3V corresponds to snapback occurring without current increasing in the current-voltage curve. Snapback is a phenomenon whereby electrons implanted from the MOS gate of the IGBT portion 21 pass through the field stop layer (n-type buffer layer 10) and flow into the n⁺-type cathode region 12 of the FWD portion 22 neighboring the IGBT portion 21, because of which hole implantation from the p⁺-type collector region 11 of the IGBT portion 21 is impeded. In order to restrict the snapback phenomenon, it is necessary that the width $W_{IGBT}$ of the IGBT portion 21 is a width such that the on-state voltage is lower than 1.3V.

Specifically, although also depending on the unit cell dimension of the IGBT portion 21, that is the repetitive pitch of the trench 2, when the repetitive pitch of the trench 2 is 1 μm or greater, it is necessary that the width $W_{FWD}$ of the FWD portion 22 is at least 1 μm, because of which it is good when the width $W_{IGBT}$ of the IGBT portion 21 is 20 μm or greater. Note that the FWD portion 22 normally bears a greater current density than the IGBT portion 21, with the current density ratio being such that the current density of the FWD portion 22 is two times or more greater than that of the IGBT portion 21. Therefore, the ratio between the widths of the IGBT portion 21 and FWD portion 22 (=$W_{IGBT}/W_{FWD}$) is 2 or more. In this case, taking the width $W_{FWD}$ of the FWD portion 22 to be 10 μm, increase in the on-state voltage can be restricted provided that the width $W_{IGBT}$ of the IGBT portion 21 is 20 μm or greater. Also, it is necessary that when the width $W_{FWD}$ of the FWD portion 22 is, for example, 100 μm, the width $W_{IGBT}$ of the IGBT portion 21 is 100 μm or greater, and when the width $W_{FWD}$ of the FWD portion 22 is, for example, 1,000 μm, the width $W_{IGBT}$ of the IGBT portion 21 is 1,000 μm or greater. When the region width of each of the IGBT portion 21 and FWD portion 22 is greater than the hole diffusion length, current flows in each of the IGBT portion 21 and FWD portion 22, because of which bias occurs in the current. Consequently, it is particularly preferable that the width $W_{IGBT}$ of the IGBT portion 21 is 300 μm or less, in which case it is preferable that the width $W_{FWD}$ of the FWD portion 22, although also depending on the current density ratio, is 150 μm or less. According to the above, it is preferable that the width $W_{IGBT}$ of the IGBT portion 21 is 20 μm or more, 300 μm or less, and that the width $W_{FWD}$ of the FWD portion 22 is 10 μm or more, 150 μm or less. In particular, by the width $W_{IGBT}$ of the IGBT portion 21 being 20 μm or more, 100 μm or less, and the width $W_{FWD}$ of the FWD portion 22 being 10 μm or more, 50 μm or less, a balance can be achieved between restricting the snapback phenomenon and the advantage of in-chip current dispersion.

Also, as a Modification Example 1 of Embodiment 2, the mesa width w20 between trenches 2 may be further reduced beyond 4 μm. A built-in depletion layer is spreading in the mesa portion from the boundary between the trench 2 and mesa portion. By further reducing the mesa width w20 of the mesa portion, thereby linking the built-in depletion layers spreading from the trench 2 on either side, the mesa portion can be completely depleted at zero bias. Therefore, even when adopting only a Schottky contact of the n⁻-type drift region 1 and anode electrode, without forming the p-type anode region 5-2, in the FWD portion 22, a depletion layer spreads in the mesa portion from the trench 2, and can cause pinch-off to occur. Therefore, the commonly known barrier height lowering phenomenon with reverse bias of an extent near to the breakdown voltage of the element can be suppressed. Therefore, even when there is no p-type anode region 5-2 such as, for example, an existing MPS (merged PiN Schottky) diode, an increase in leakage current accompanying an increase in reverse bias can be suppressed. Furthermore, as there is absolutely no hole implantation from the p-type anode region 5-2, and the amount of hole implantation is determined by only the barrier height of the barrier metal, hole implantation efficiency can be dramatically reduced.

Actually, not only a Schottky contact of the n⁻-type drift region 1 and anode electrode, but also the p-type anode region 5-2, of which the trench 2 lateral direction width is further reduced with respect to the mesa width w20 between trenches 2, is formed in the mesa portion, and the repetitive pitch in the trench 2 longitudinal direction of the p-type anode region 5-2 may be ten times or more greater than the mesa width w20 between trenches 2. By so doing, the anode ratio α is less than 10%, and hole implantation from the p-type anode region 5-2 can be sufficiently reduced to the extent of being only that of the Schottky contact of the n⁻-type drift region 1 and anode electrode (anode ratio α=0%). Therefore, the reverse recovery peak current Irp can be dramatically reduced, and the p-type anode region 5-2 increases the pinch-off effect of the depletion layer when there is reverse bias. Therefore, leakage current is less liable to be affected by defects at the Schottky interface than when there is only a Schottky contact of the n⁻-type drift region 1 and anode electrode, and the element characteristics can be stabilized.

Figure 26:
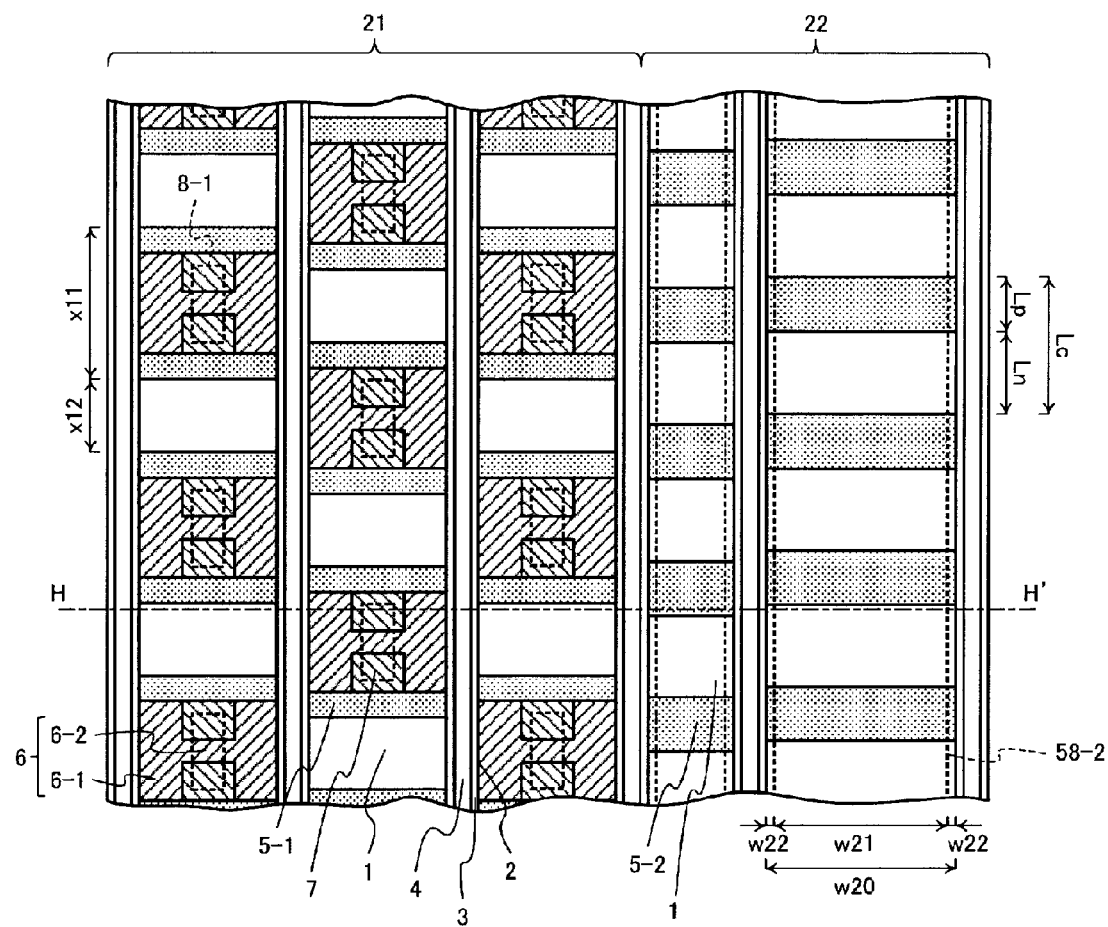
FIG. 26 is a plan view showing another example of the semiconductor device according to Embodiment 2.
Figure 27:
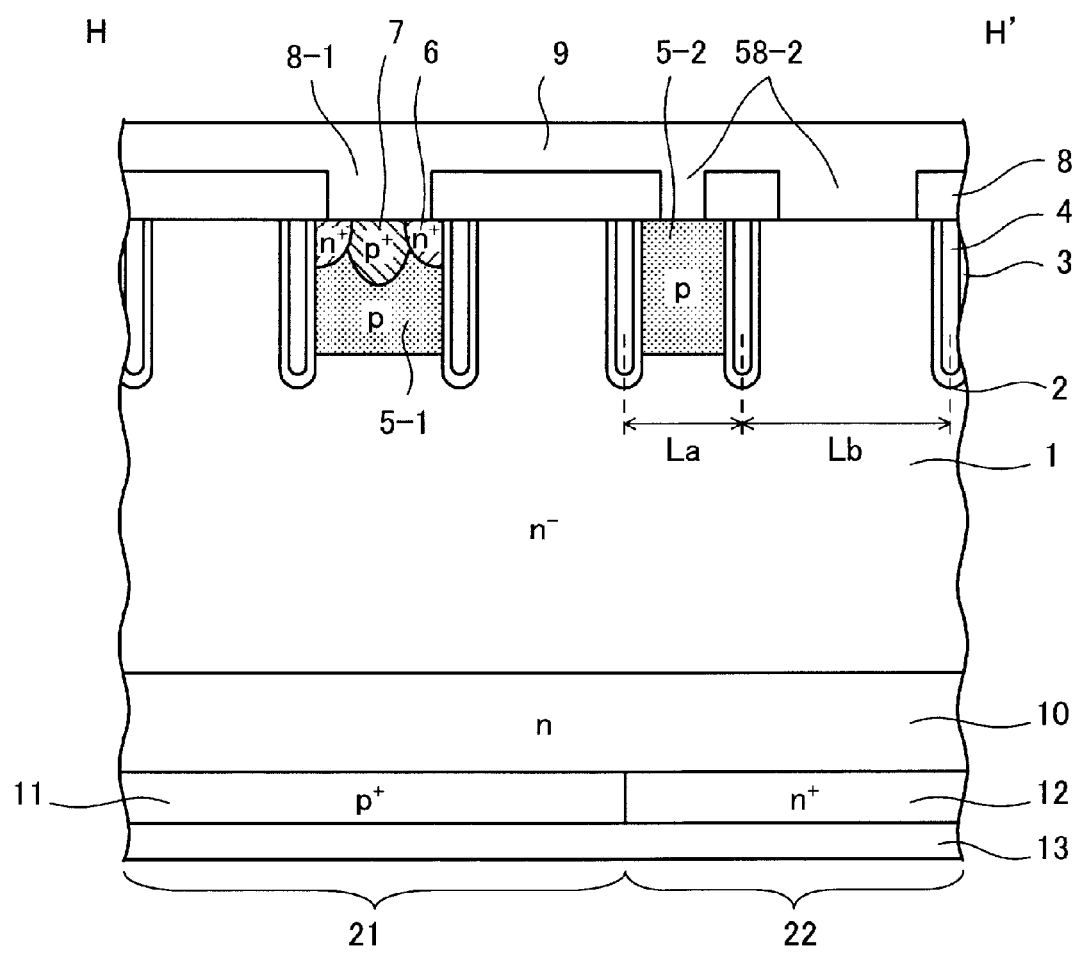
FIG. 27 is a sectional view showing the sectional structure along a cutting line H-H' of FIG. 26.
Figure 28:
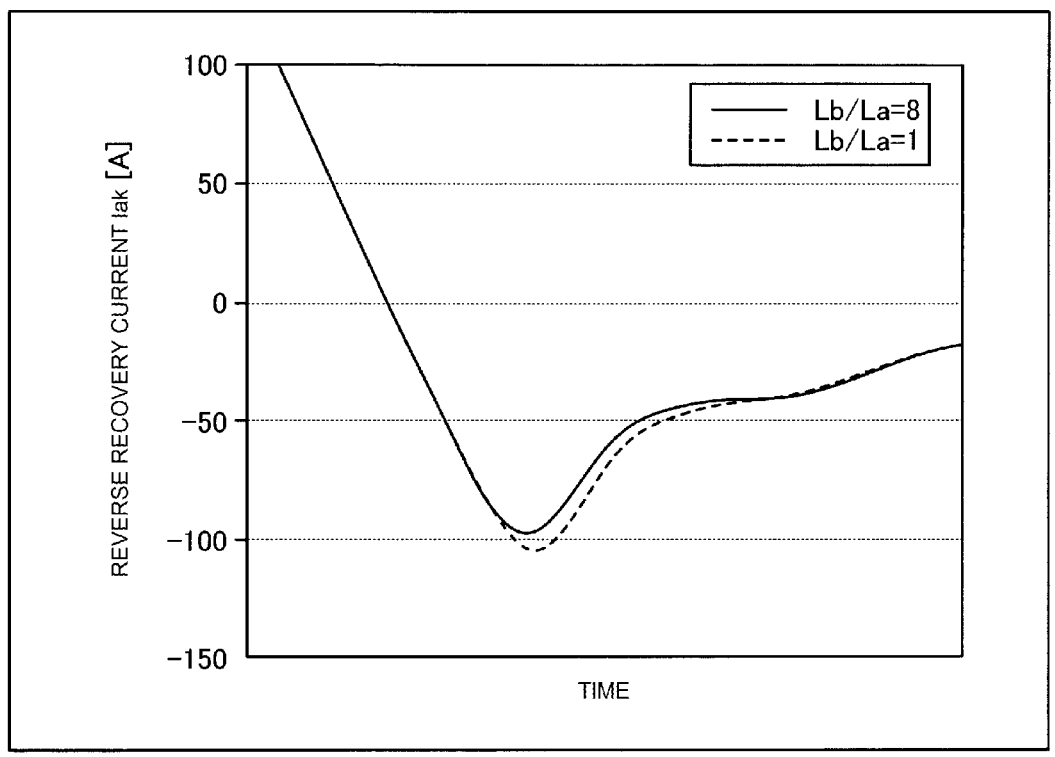
FIG. 28 is a characteristic diagram showing the relationship between a trench interval ratio Lb/La and reverse recovery current $I_{AK}$ of the semiconductor device of FIG. 26.

Also, as a Modification Example 2 of Embodiment 2, the trench 2 of the FWD portion 22 may be provided at differing trench intervals. FIG. 26 is a plan view showing another example of the semiconductor device according to Embodiment 2. FIG. 27 is a sectional view showing the sectional structure along a cutting line H-H' of FIG. 26. As shown in FIGS. 26 and 27, the trench 2 of the FWD portion 22 may be disposed at, for example, a first trench interval La and a second trench interval Lb wider than the first trench interval La. The relationship between the ratio of the second trench interval Lb to the first trench interval La of the trench 2 (=Lb/La, hereafter referred to as the trench interval ratio Lb/La) and a reverse recovery current $I_{AK}$ when the anode ratio α of the FWD portion 22 is 50% in Modification Example 2 of Embodiment 2 is shown in FIG. 28. FIG. 28 is a characteristic diagram showing the relationship between the trench interval ratio Lb/La and reverse recovery current $I_{AK}$ of the semiconductor device of FIG. 26. FIG. 28 shows the reverse recovery current waveform when the trench interval ratio Lb/La=8 and, as a comparison, the reverse recovery current waveform when the trench interval ratio Lb/La=1. As shown in FIG. 28, it is found that, by the second trench interval Lb of the trench 2 being greater than the first trench interval La, the reverse recovery peak current Irp decreases in comparison with when the first trench interval La and second trench interval Lb are equal.

Figure 29A:
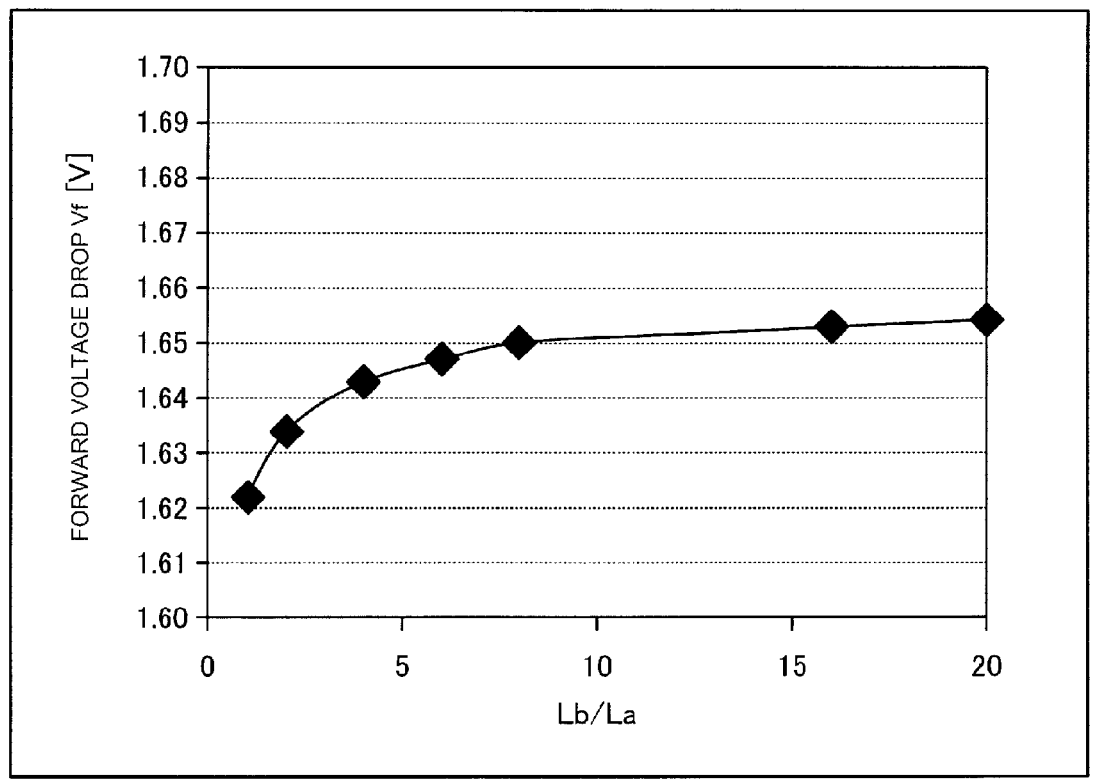
FIG. 29A is a characteristic diagram showing the relationship between the trench interval ratio Lb/La and a forward voltage drop Vf of the semiconductor device of FIG. 26.
Figure 29B:
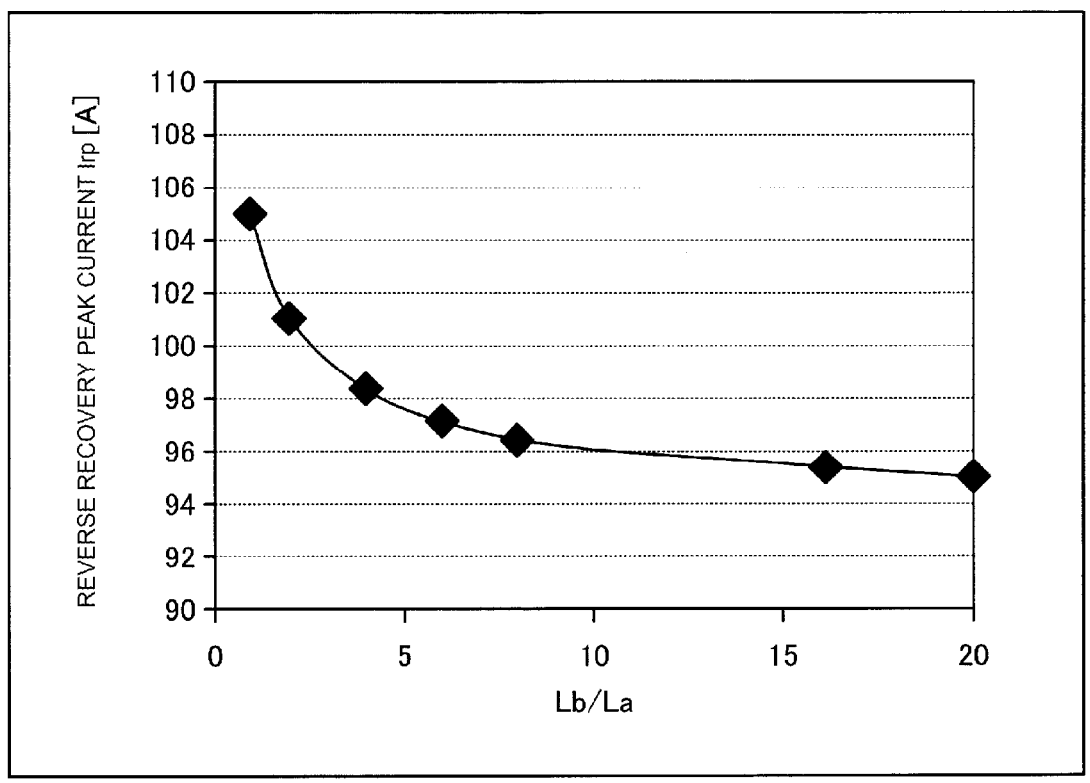
FIG. 29B is a characteristic diagram showing the relationship between the trench interval ratio Lb/La and a reverse recovery peak current Irp of the semiconductor device of FIG. 26.

Also, the relationship between the trench interval ratio Lb/La and a forward voltage drop Vf, and the relationship between the trench interval ratio Lb/La and the reverse recovery peak current Irp, when the second trench interval Lb of the trench 2 is greater than the first trench interval La are shown in FIGS. 29A and 29B respectively. FIG. 29A is a characteristic diagram showing the relationship between the trench interval ratio Lb/La and forward voltage drop Vf of the semiconductor device of FIG. 26. FIG. 29B is a characteristic diagram showing the relationship between the trench interval ratio Lb/La and reverse recovery peak current Irp of the semiconductor device of FIG. 26. The data point farthest to the left in FIGS. 29A and 29B is the data point when the trench interval ratio Lb/La=1. As shown in FIG. 29A, when the trench interval ratio Lb/La is greater than 1, the forward voltage drop Vf gradually increases as the trench interval ratio Lb/La becomes greater, but the amount by which the forward voltage drop Vf increases is approximately 3% even when the trench interval ratio Lb/La=20. Meanwhile, as shown in FIG. 29B, the reverse recovery peak current Irp gradually decreases as the trench interval ratio Lb/La becomes greater. The amount by which the reverse recovery peak current Irp decreases is approximately 10% when the trench interval ratio Lb/La=20. That is, when the trench interval ratio Lb/La is greater than 1, the advantage of the decrease in the reverse recovery current $I_{AK}$ is large in comparison with the forward voltage drop Vf.

Figure 30A:
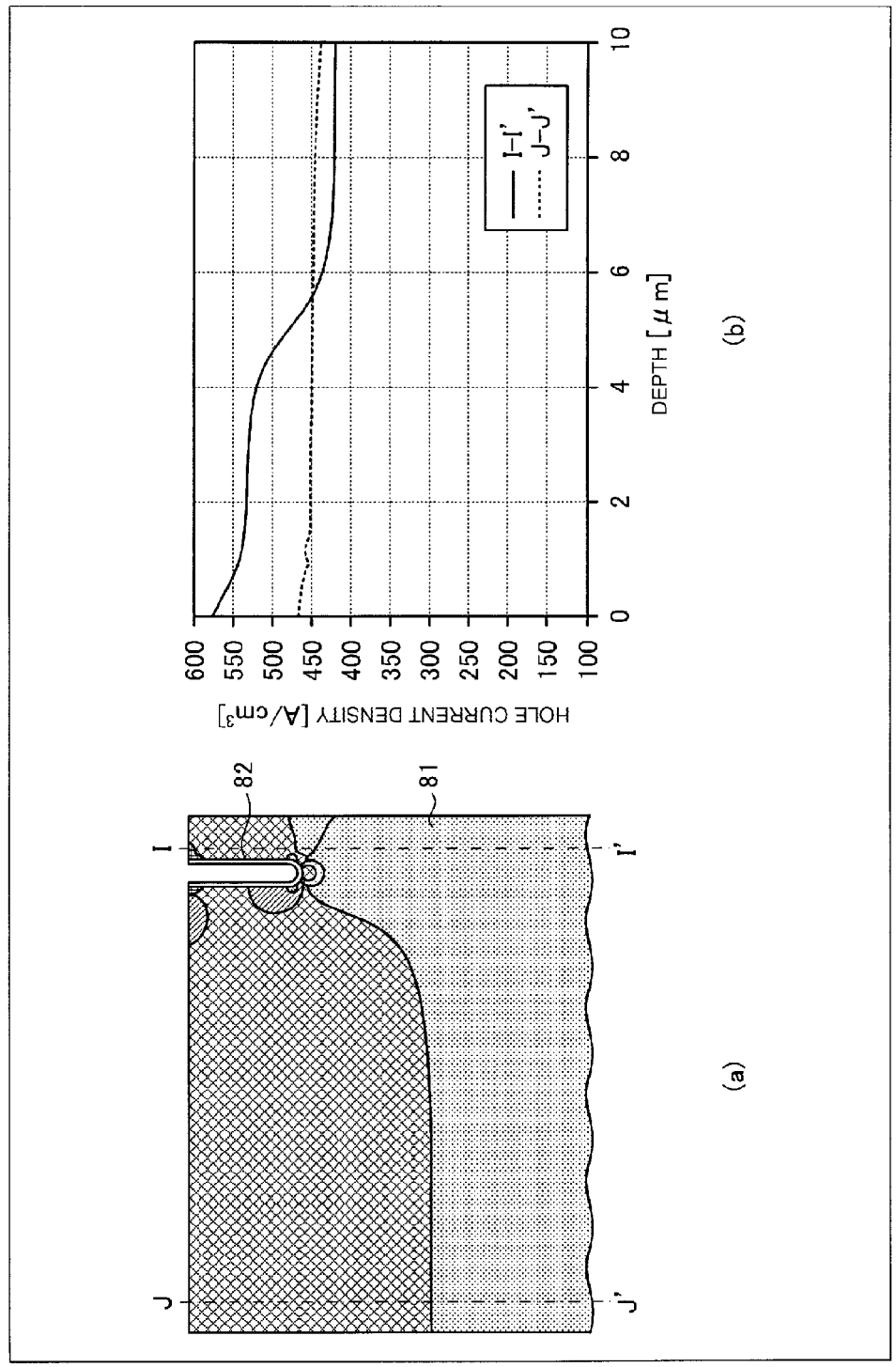
FIG. 30A is a characteristic diagram showing the current density in a diode when causing a steady forward current to be conducted (trench interval ratio Lb/La=8).
Figure 30B:
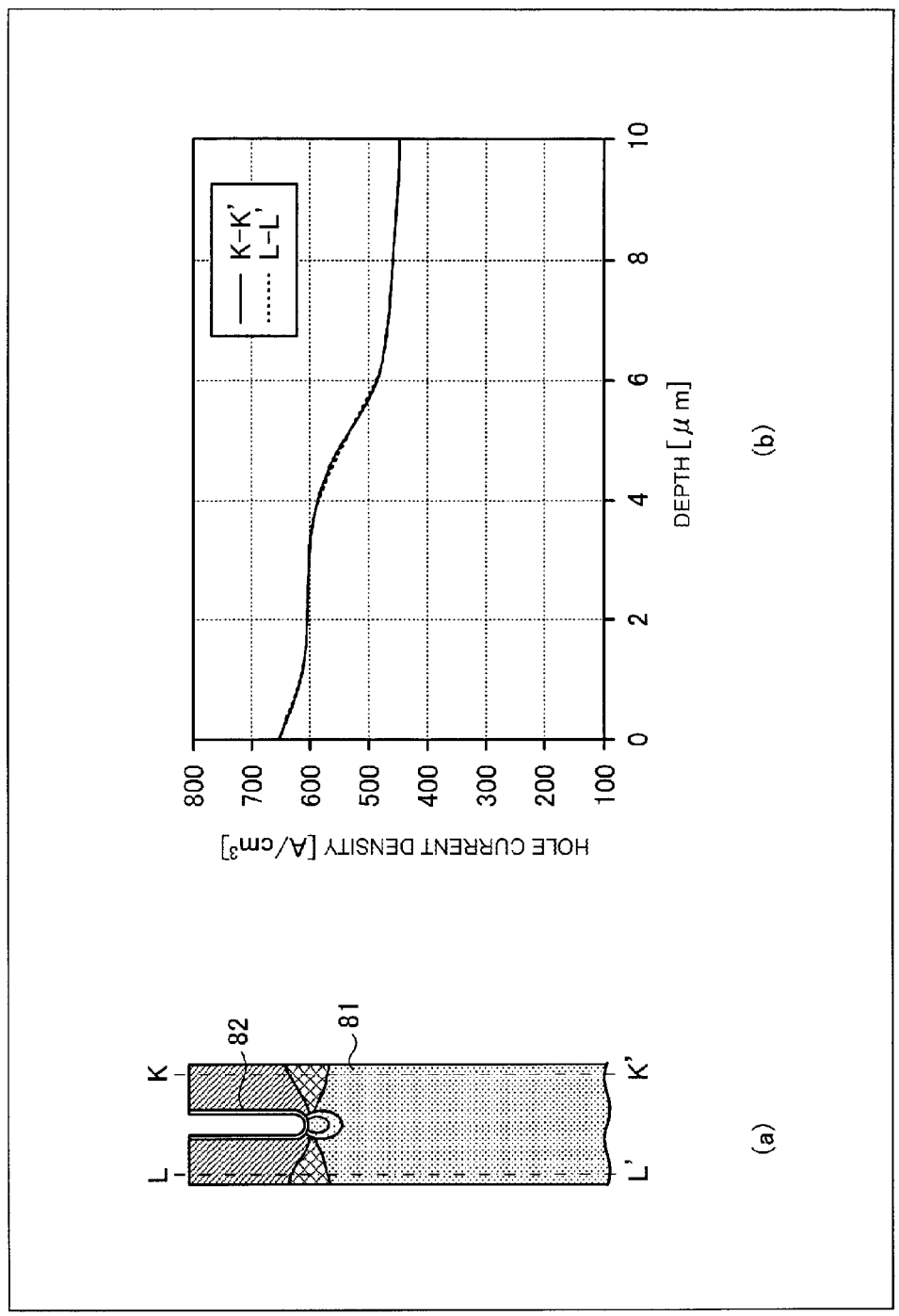
FIG. 30B is a characteristic diagram showing the current density in the diode when causing a steady forward current to be conducted (trench interval ratio Lb/La=1).

The reason for the advantage of the decrease in the reverse recovery current $I_{AK}$ being large in comparison with the forward voltage drop Vf when the trench interval ratio Lb/La is greater than 1 will be described using FIGS. 30A and 30B. FIGS. 30A and 30B are characteristic diagrams showing the current density inside the diode when caused to conduct a steady forward current (=400 A/cm²). FIG. 30A(a) shows the current density distribution when the trench interval ratio Lb/La=8. FIG. 30A(b) shows the current density distribution in sections cut along cutting lines I-I' and J-J' of FIG. 30A(a). FIG. 30B(a) shows the current density distribution when the trench interval ratio Lb/La=1. FIG. 30B(b) shows the current density distribution in sections cut along cutting lines K-K' and L-L' of FIG. 30A(a). In FIGS. 30A(a) and 30B(a), only one trench 82 is shown, and trenches 82 neighboring this trench 82 on either side in the lateral direction are omitted, but a region of a semiconductor substrate 81 to the right of the trench 82 is a region sandwiched by trenches 82 neighboring at the first trench interval La, while a region to the left of the trench 82 is a region sandwiched by trenches 82 neighboring at the second trench interval Lb. In FIGS. 30A(b) and 30B(b), the vertical axis is the hole current density, while the horizontal axis is the depth from the front surface (depth=0 μm) of the semiconductor substrate 81. The differing hatchings shown inside the semiconductor substrate 81 indicate high and low hole current densities, and as shown in FIGS. 30A(b) and 30B(b), the hole current density inside the semiconductor substrate 81 becomes lower the greater the depth from the front surface of the semiconductor substrate 81. Also, the hole current density inside the semiconductor substrate 81 becomes lower the farther from the trench 82 in the lateral direction of the trench 82.

When the trench interval ratio Lb/La=8, the sum (hereafter, the pitch La+Lb) of the smallest numerals (that is, 1 and 8) among positive integers satisfying the trench interval ratio Lb/La=8 is 9 (=1+8), and when the trench interval ratio Lb/La=1, the pitch La+Lb is 2 (=1+1). That is, the pitch La+Lb when the trench interval ratio Lb/La=8 is 4.5 times greater than the pitch La+Lb when the trench interval ratio Lb/La=1, and the current density when the trench interval ratio Lb/La=8 is lower overall by that amount than the current density when the trench interval ratio Lb/La=1. Furthermore, when the trench interval ratio Lb/La=8, the current density of the narrow region of the semiconductor substrate 81 sandwiched by trenches 82 neighboring at the first trench interval La is higher than the current density of another region. In particular, the pitch La+Lb being large is the reason the increase in the forward voltage drop of is suppressed to in the region of 2%. Meanwhile, in the case of the reverse recovery current $I_{AK}$, operation in the narrow region of the semiconductor substrate 81 sandwiched by trenches 82 neighboring at the first trench interval La becomes a main operation by the anode region (not shown) being partitioned (divided) into multiple portions by the trench 82, because of which the implantation efficiency decreases. Therefore, discharge of holes when there is a reverse recovery operation is facilitated, and the reverse recovery peak current Irp decreases.

According to the above, it is good when the trench interval ratio Lb/La is greater than 1 (1<Lb/La), and preferably 2 or greater (2≤Lb/La). Also, as the characteristics are practically saturated when the trench interval ratio Lb/La is 10 or greater, it is good when the trench interval ratio Lb/La is 10 or less (Lb/La≤10), and preferably, it is good when the trench interval ratio Lb/La is 5 or less (Lb/La≤5), which can reduce the forward voltage. When focusing only on the reverse recovery current $I_{AK}$, the trench interval ratio Lb/La may be 10 or greater, but as current is liable to concentrate in a narrow region sandwiched by trenches 82 neighboring at the first trench interval La, it is preferable in terms of preventing current concentration too that the trench interval ratio Lb/La is 10 or less.

In the case of Modification Example 2 of Embodiment 2, the same advantages are achieved even when the anode ratio α is 100%, that is, the p-type anode region is formed over the whole of the FWD portion 22.

As heretofore described, according to Embodiment 2, the same advantages as in Embodiment 1 can be obtained. Also, according to Embodiment 2, the reverse recovery peak current can be further reduced by a Schottky junction of the n⁻-type drift region and emitter electrode being formed in the FWD portion. Also, according to Embodiment 2, by the p-type anode region being disposed thinned out, a depletion layer extending from the pn-junction between the p-type anode region and n⁻-type drift region, and from the boundary between the trench and n⁻-type drift region, is easily pinched off, because of which leakage current can be prevented from increasing when in an off-state.

(Embodiment 3)

Figure 17:
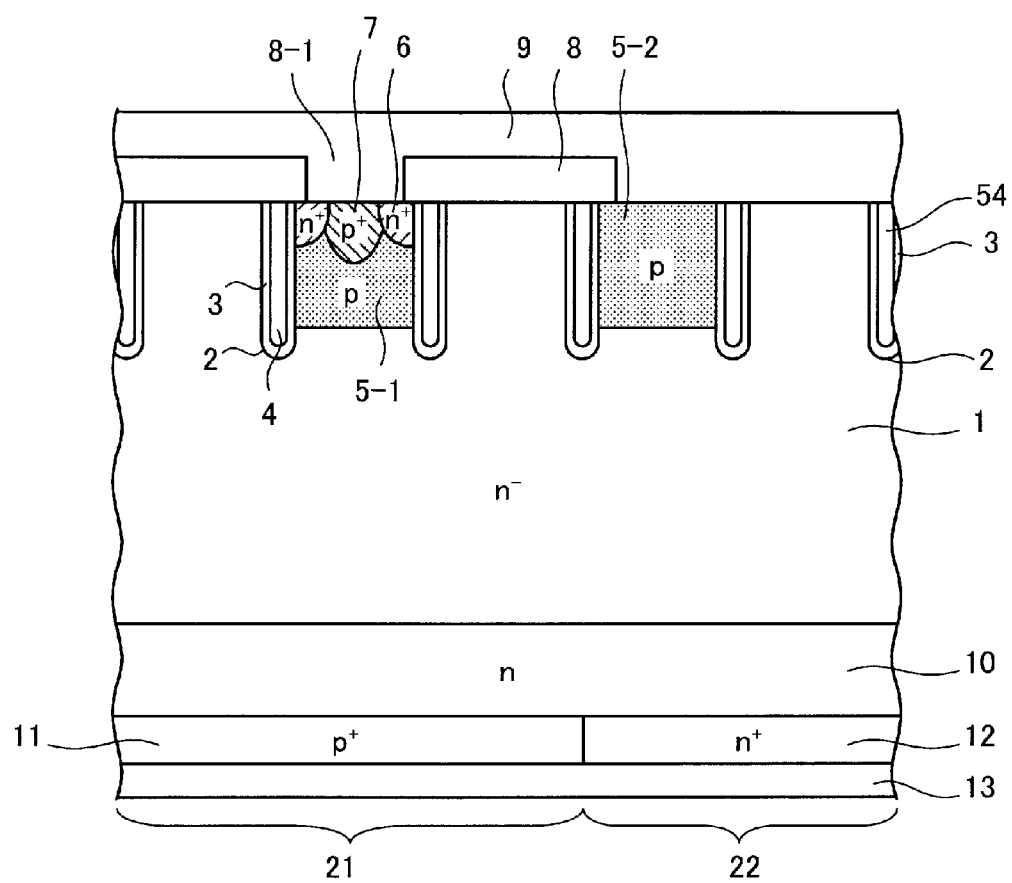
FIG. 17 is a sectional view showing the structure of a semiconductor device according to Embodiment 3.
Figure 18:
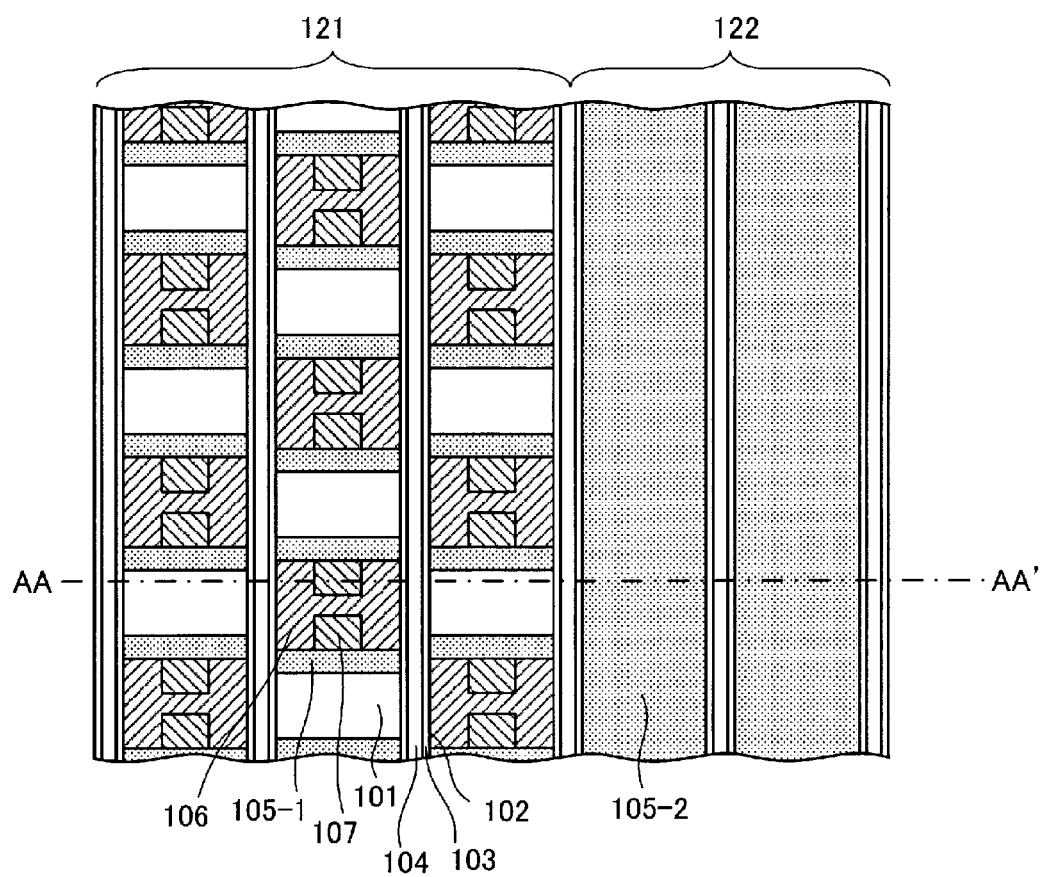
FIG. 18 is a plan view showing the structure of an existing RC-IGBT.
Figure 19:
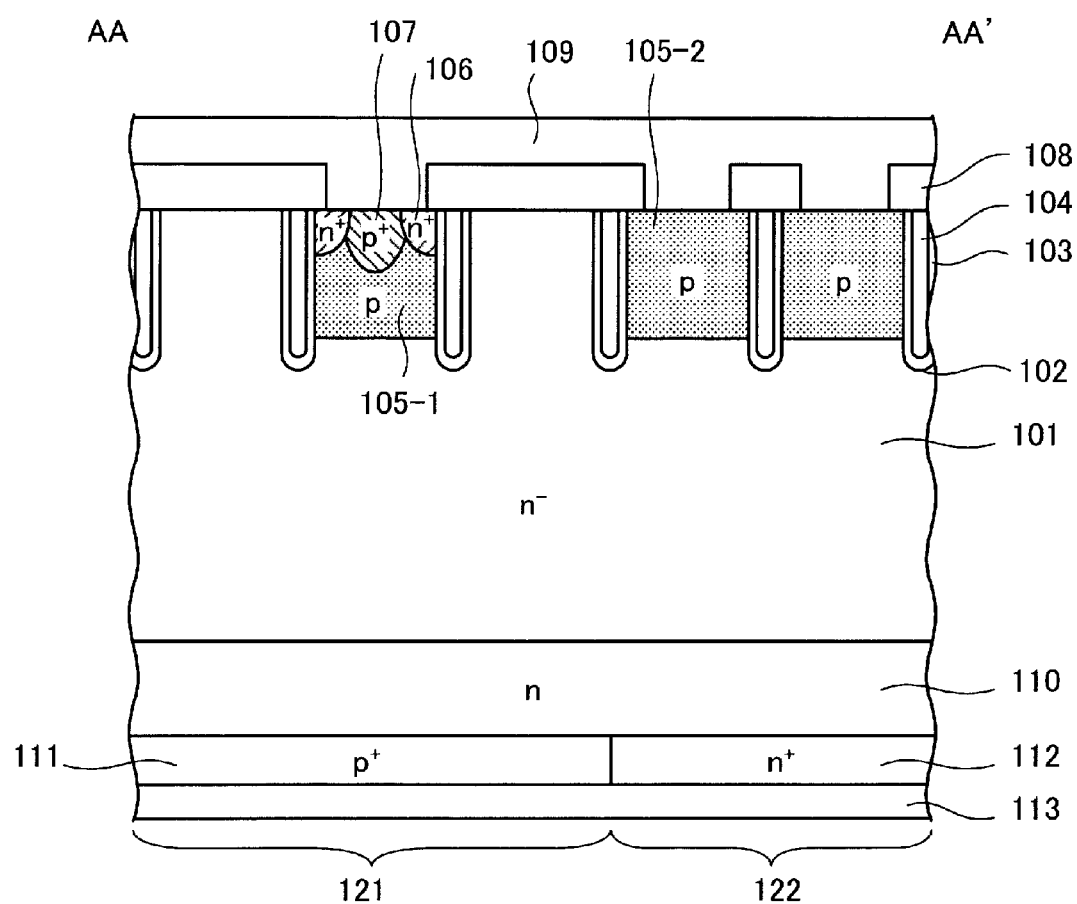
FIG. 19 is a sectional view showing the sectional structure along a cutting line AA-AA' of FIG. 18.

Next, a description will be given of the configuration of a semiconductor device according to Embodiment 3. FIG. 17 is a sectional view showing the structure of the semiconductor device according to Embodiment 3. The semiconductor device according to Embodiment 3 differs from the semiconductor device according to Embodiment 2 in that a gate electrode 54 in the FWD portion 22 and the emitter electrode 9 are conductively connected. That is, the gate electrode 54 of the FWD portion 22 is of the emitter potential. In this case, the gate electrode 4 of the IGBT portion 21 is electrically isolated from the gate electrode 54 of the FWD portion 22 in a portion omitted from the drawing.

As heretofore described, according to Embodiment 3, the same advantages as in Embodiments 1 and 2 can be obtained.

(Embodiment 4)

Figure 20A:
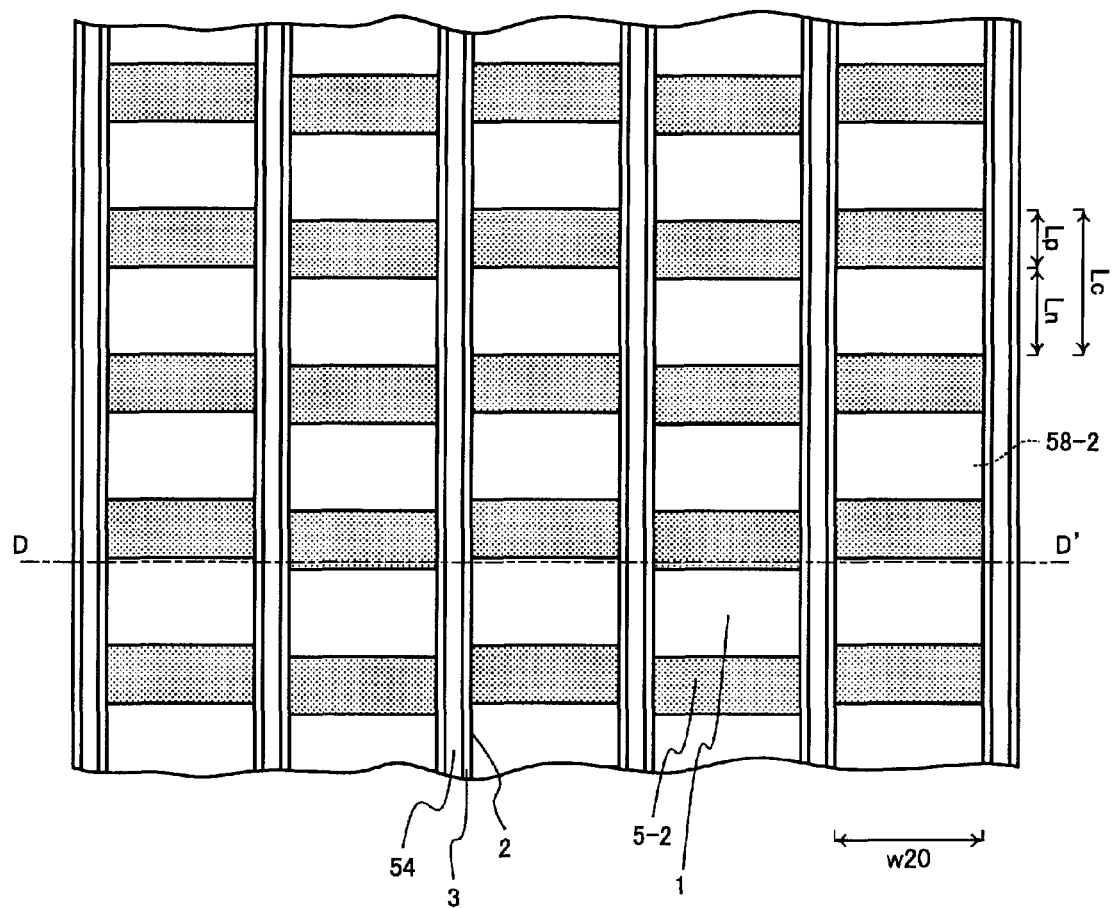
FIG. 20A is a plan view showing the structure of a semiconductor device according to Embodiment 4.
Figure 20B:
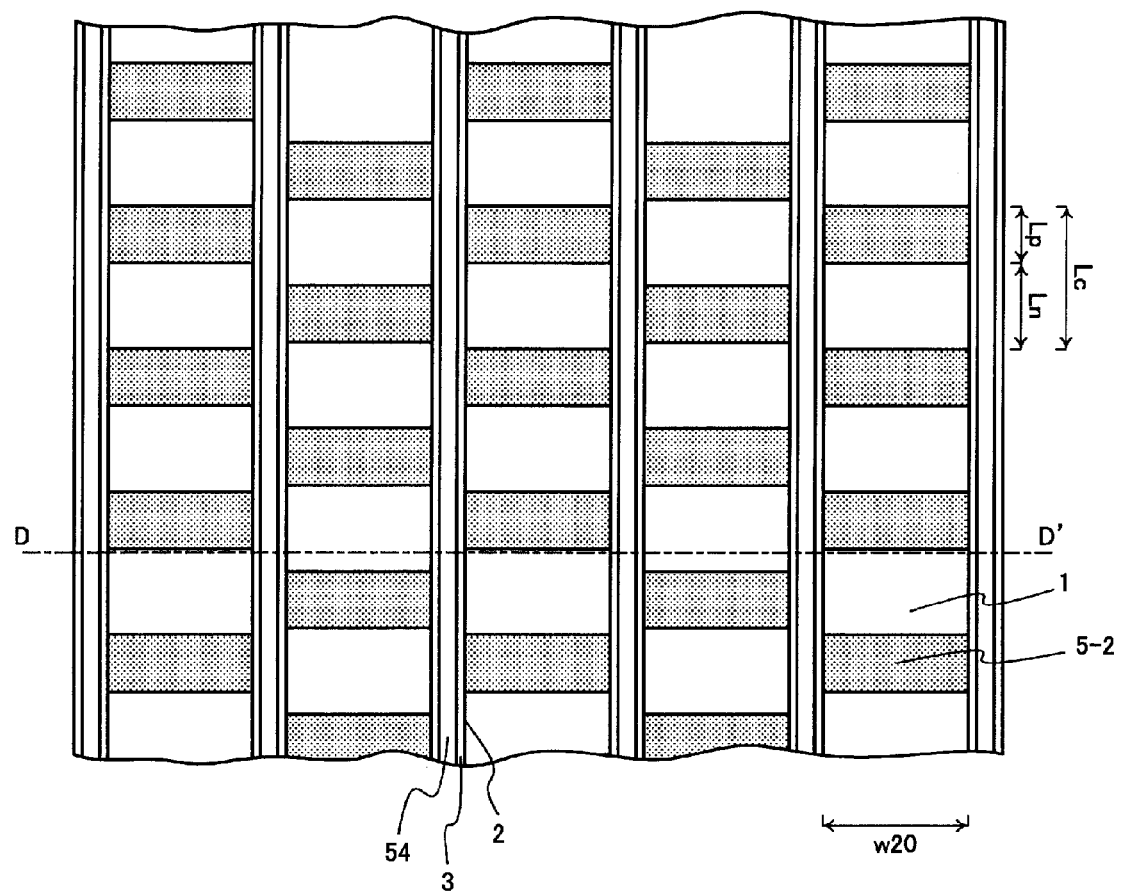
FIG. 20B is a plan view showing the structure of another example of the semiconductor device according to Embodiment 4.
Figure 21:
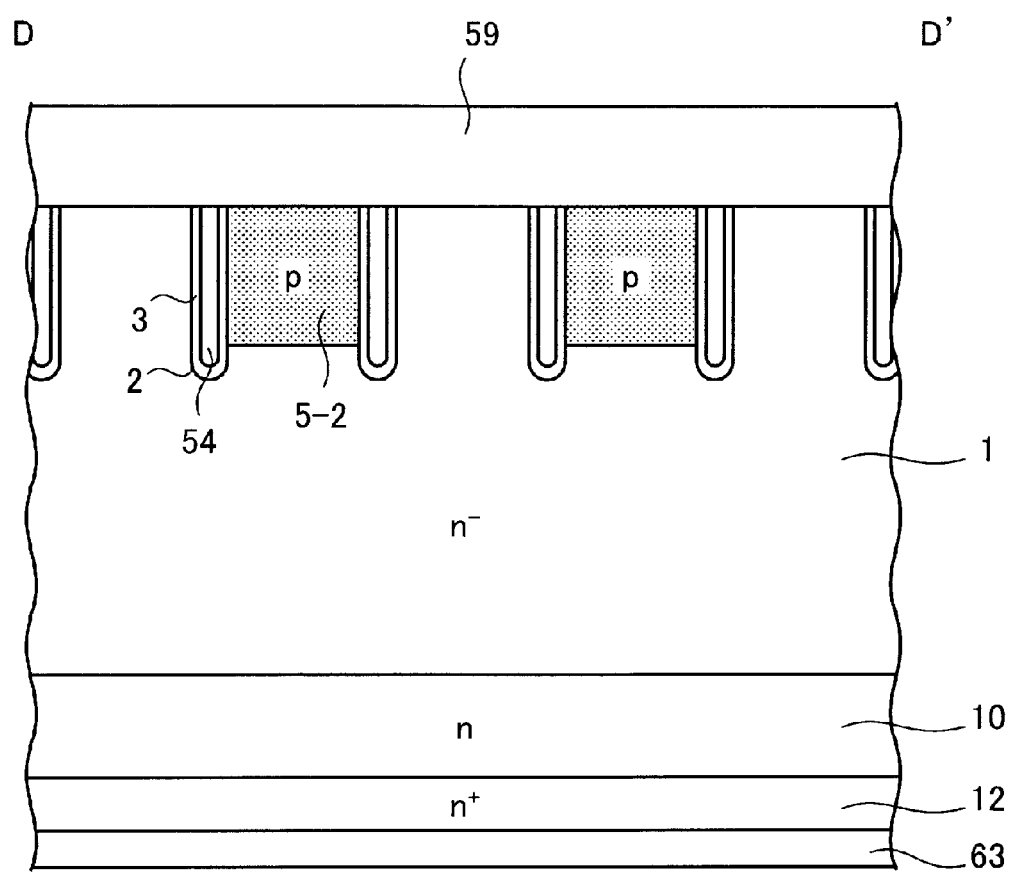
FIG. 21 is a sectional view showing the sectional structure along a cutting line D-D' of FIGS. 20A and 20B.

Next, a description will be given of the configuration of a semiconductor device according to Embodiment 4. FIG. 20A is a plan view showing the structure of the semiconductor device according to Embodiment 4. FIG. 20B is a plan view showing the structure of another example of the semiconductor device according to Embodiment 4. FIG. 21 is a sectional view showing the sectional structure along a cutting line D-D' of FIGS. 20A and 20B. The semiconductor device according to Embodiment 4, being only the FWD portion in Embodiment 3, is a diode of a configuration wherein built-in depletion layers spreading in a mesa portion from trenches 2 on either side are linked. Configurations other than this of the semiconductor device according to Embodiment 4 are the same as in Embodiment 3. Reference sign 59 is an anode electrode, while reference sign 63 is a cathode electrode.

For example, when the rated voltage is 600V to 6,500V, the resistivity of an n⁻-type silicon substrate that is to form the n⁻-type drift region 1 is typically 30 Ωcm to 325 Ωcm, wherein the unit of a value that is 0.05 times the rated voltage is converted. Therefore, the width of a built-in depletion layer spreading in the mesa portion from the trench 2 on one side, using Poisson's equation, is approximately 2.4 μm to 7.8 μm. Consequently, provided that the mesa width w20 between trenches 2 is less than 4.8 μm to 15.6 μm when the rated voltage is 600V to 6,500V, the built-in depletion layers spreading from the trench 2 on either side of the mesa portion link up. More preferably, by further reducing the mesa width w20 between trenches 2 so as to be, for example, 2.4 μm to 7.8 μm or less, half of the previously mentioned values, when the rated voltage is 600V to 6,500V, an increase in leakage current due to the mirror image effect can be still more reliably suppressed.

When the mesa width w20 between trenches 2 is 4.8 μm to 15.6 μm when the rated voltage is 600V to 6,500V, taking the rated voltage to be V and the trench mesa width to be W, it is sufficient that the mesa width w20 with respect to the rated voltage V is calculated in accordance with Expression (2) below.

$$W = -1.12590 \times 10^{-21} \cdot V^6 + 2.36081 \times 10^{-17} \cdot V^5 - 2.00947 \times 10^{-13} \cdot V^4 + 9.15899 \times 10^{-10} \cdot V^3 - 2.55808 \times 10^{-6} \cdot V^2 + 6.11403 \times 10^{-3} \cdot V + 2.01005 \times 10^{0} \quad (2)$$

Expression (2) defines the resistivity of a typical semiconductor substrate with respect to the rated voltage V using the heretofore described method, and is such that the built-in depletion layer width is obtained in accordance with Poisson's equation at seven points of the rated voltage V between 600V and 6,500V (600V, 1,200V, 1,700V, 2,500V, 3,300V, 4,500V, and 6,500V), and the values fitted with a sextic polynomial expression. When reducing the mesa width w20 between trenches 2, it is sufficient that the mesa width w20 is smaller than the value of the mesa width w20 calculated using Expression (2), for example, it is sufficient that the mesa width w20 between trenches 2 is one-half of the value of the mesa width w20 calculated using Expression (2).

Also, as shown in FIG. 20B, the p-type anode region 5-2 may be disposed so as to oppose a region (the n⁻-type drift region 1) between two p-type anode regions 5-2 neighboring across the trench 2. As holes are implanted from the p-type anode region 5-2, the current density of a portion below the p-type anode region 5-2 increases. Provided that the p-type anode region 5-2 is disposed as in FIG. 20B, p-type anode regions 5-2 neighboring across the trench 2 are distanced from each other, because of which regions with high current density are dispersed, and heat generation, current crowding, and the like, can be restricted.

In this way, according to Embodiment 4, a diode wherein increase in leakage current is suppressed can be obtained by sufficiently reducing the mesa width between trenches, even when there is no p-type anode region.

(Embodiment 5)

Figure 22A:
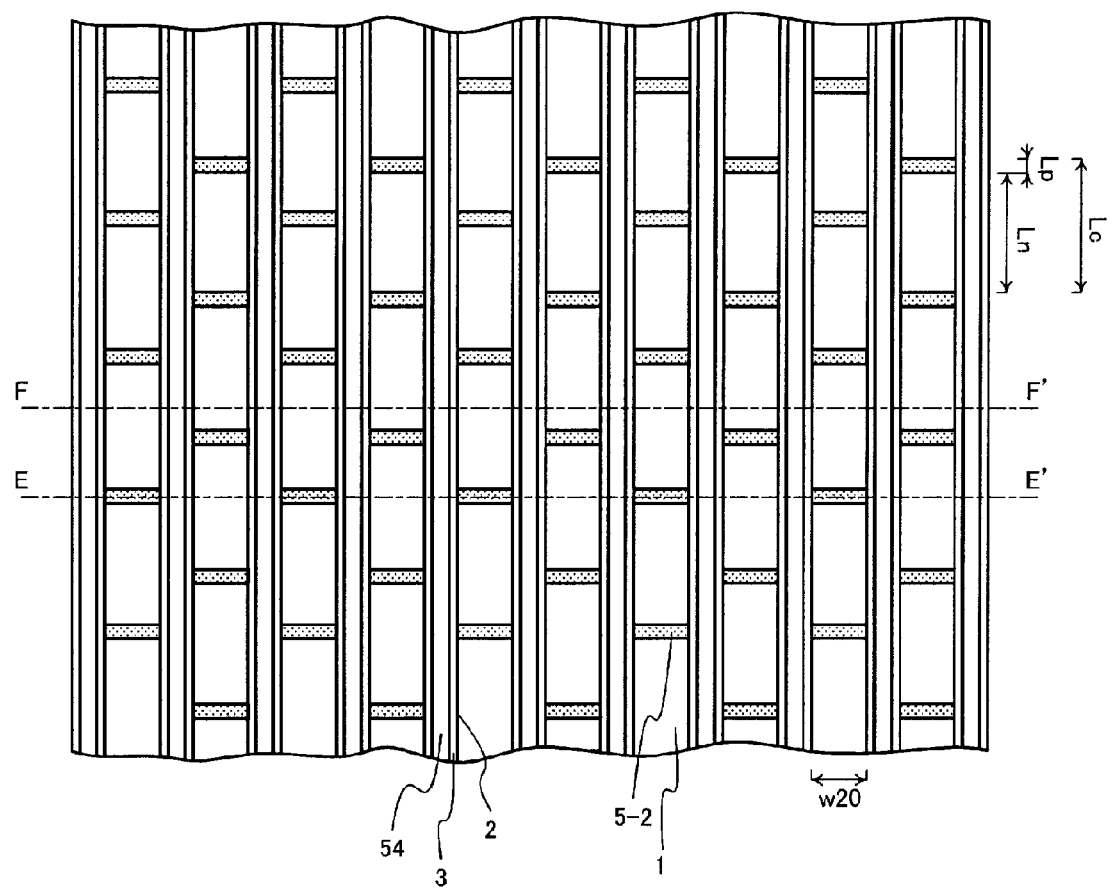
FIG. 22A is a plan view showing the structure of a semiconductor device according to Embodiment 5.
Figure 22B:
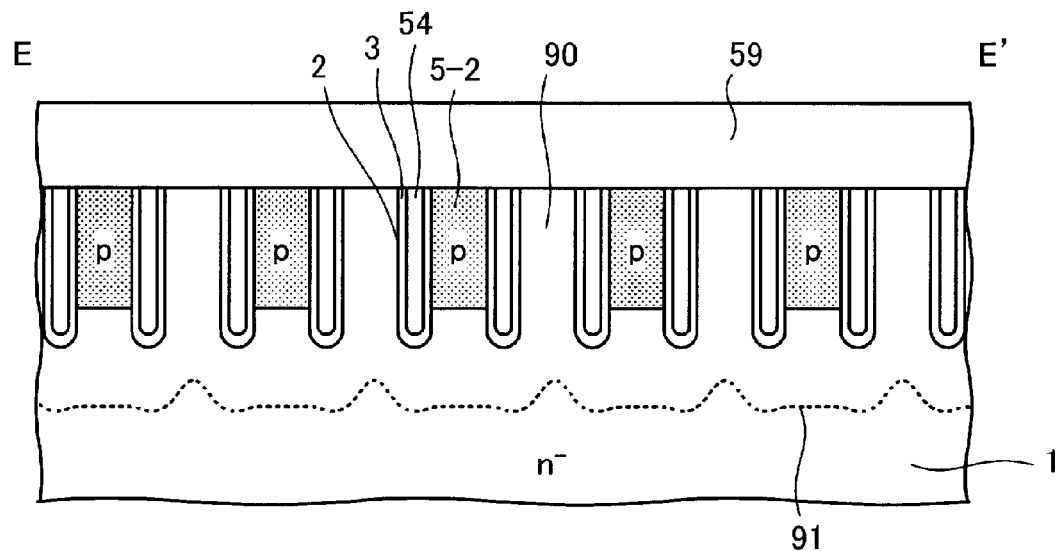
FIG. 22B is a sectional view showing the sectional structure along a cutting line E-E' of FIG. 22A.
Figure 22C:
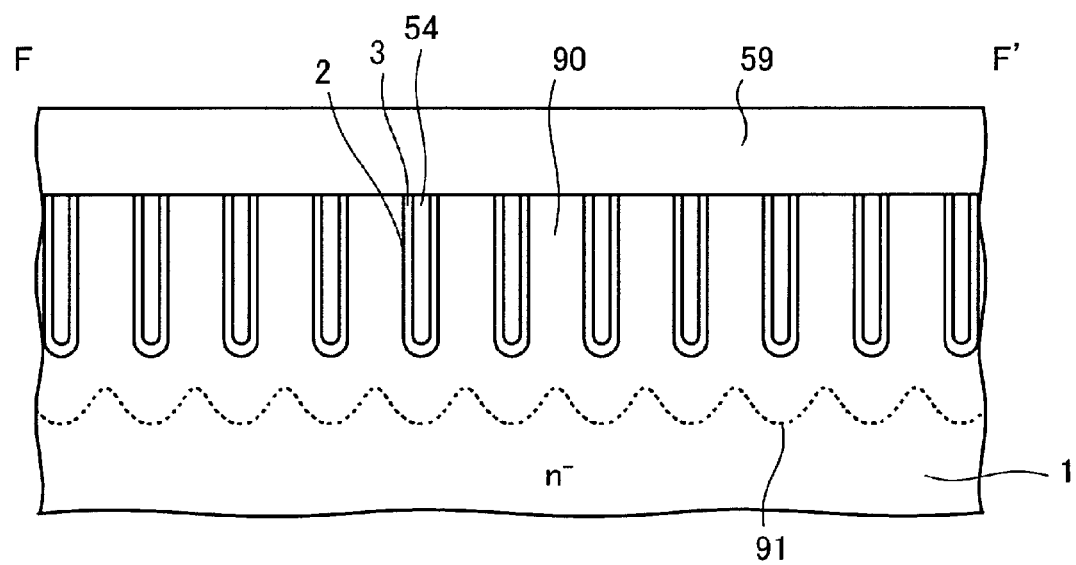
FIG. 22C is a sectional view showing the sectional structure along a cutting line F-F' of FIG. 22A.

Next, a description will be given of the configuration of a semiconductor device according to Embodiment 5. FIG. 22A is a plan view showing the structure of the semiconductor device according to Embodiment 5. FIG. 22B is a sectional view showing the sectional structure along a cutting line E-E' of FIG. 22A. FIG. 22C is a sectional view showing the sectional structure along a cutting line F-F' of FIG. 22A. The semiconductor device according to Embodiment 5 differs from the semiconductor device according to Embodiment 4 in the following two ways. The first difference is that the p-type anode region 5-2 is selectively formed in the trench 2 longitudinal direction so that the anode ratio α is 10% or less. The second difference is that the repetitive pitch of the trench 2 is sufficiently smaller than the built-in depletion layer width, for example, the mesa width w20 between trenches 2 is one-half or less of the value of Expression (2), and equal to or greater than the width in the lateral direction of the trench 2.

FIGS. 22B and 22C show aspects of a built-in depletion layer 90 spreading. The built-in depletion layer 90 is a depletion layer that spreads into the n$^-$-type drift region 1 from the pn-junction between the p-type anode region 5-2 and n$^-$-type drift region 1 in a state of thermal equilibrium, with no voltage being applied to the anode electrode 59 or a cathode electrode (not shown). When the mesa width w20 between trenches 2 is one-half or less of the value of Expression (2), built-in depletion layers 90 spreading into the mesa portion from neighboring trenches 2 are connected with each other, as shown in FIG. 22B. Therefore, a depletion layer end 91 of the built-in depletion layer 90 is at a depth equivalent to the depth of the p-type anode region 5-2, and the surface form of the depletion layer end 91 of the built-in depletion layer 90 is in a practically flat state parallel to the substrate main surface. Therefore, the depletion layer end 91 of the built-in depletion layer 90 is of a form near that of a planar junction, and breakdown voltage increases. A planar junction is a pn-junction between the p-type anode region 5-2 and n$^-$-type drift region 1 when the p-type anode region 5-2 is provided uniformly in a surface layer of the front surface of the n$^-$-type semiconductor substrate.

Also, by the depletion layer end 91 of the built-in depletion layer 90 being of a form near that of a planar junction, a decrease in the barrier height at a Schottky contact can also be restricted, because of which there is almost no increase in leakage current even when a high voltage is applied. Furthermore, even when the second pitch in the trench 2 longitudinal direction of the p-type anode region 5-2 is sufficiently longer than the width of the built-in depletion layer 90, and the anode ratio α is 10% or less, neither breakdown voltage nor leakage current depends on the second pitch in the trench 2 longitudinal direction of the p-type anode region 5-2. Therefore, implantation of holes from the p-type anode region 5-2 into the n$^-$-type drift region 1 can be practically ignored. Also, as shown in FIG. 22C, the surface form of the depletion layer end 91 of the built-in depletion layer 90 is sufficiently near that of a planar junction even in a region in which the p-type anode region 5-2 is not provided on the cutting line. This kind of structure is such that the hole implantation efficiency of the anode electrode 59 can be dramatically reduced (to 10% or less) by the anode ratio α being 10% or less, because of which reverse recovery current can be reduced without causing a decrease in breakdown voltage or an increase in leakage current.

As heretofore described, according to Embodiment 5, the same advantages as in Embodiments 3 and 4 can be obtained.

(Embodiment 6)

Figure 23A:
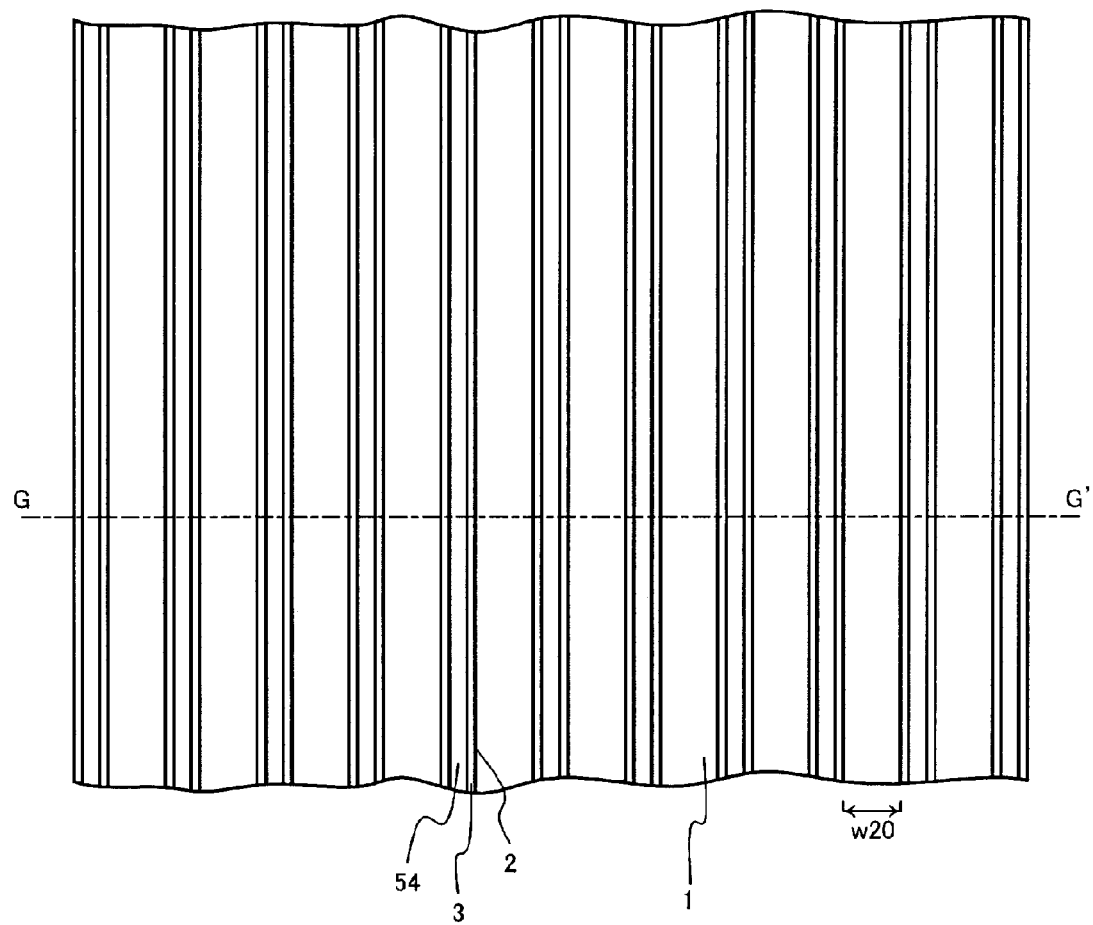
FIG. 23A is a plan view showing the structure of a semiconductor device according to Embodiment 6.
Figure 23B:
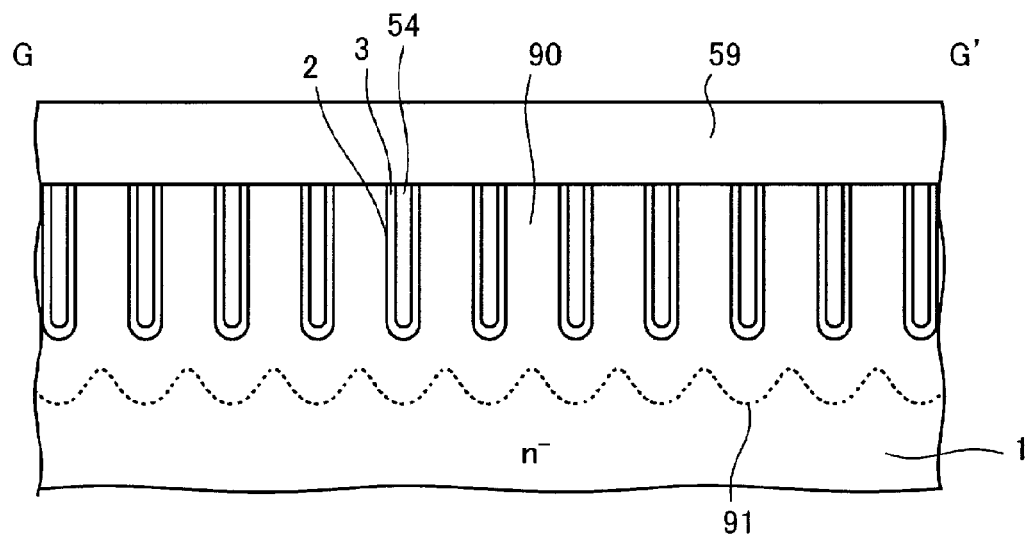
FIG. 23B is a sectional view showing the sectional structure along a cutting line G-G' of FIG. 23A.
Figure 23C:
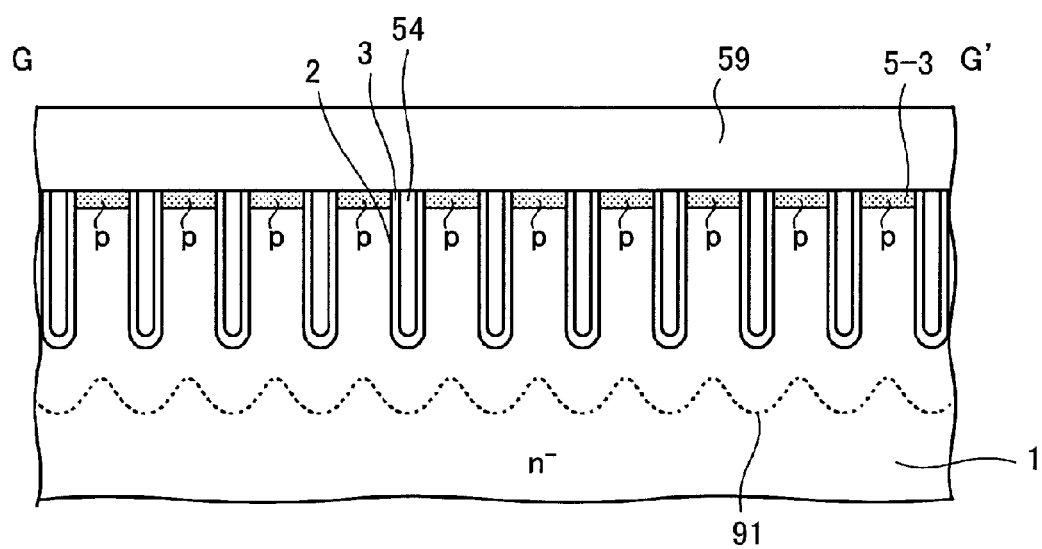
FIG. 23C is a sectional view showing another example of the sectional structure along the cutting line G-G' of FIG. 23A.

Next, a description will be given of the configuration of a semiconductor device according to Embodiment 6. FIG. 23A is a plan view showing the structure of the semiconductor device according to Embodiment 6. FIG. 23B is a sectional view showing the sectional structure along a cutting line G-G' of FIG. 23A. FIG. 23C is a sectional view showing another example of the sectional structure along the cutting line G-G' of FIG. 23A. The semiconductor device according to Embodiment 6 differs from the semiconductor device according to Embodiment 5 in that there is only a Schottky contact of the n$^-$-type drift region 1 and anode electrode 59, as shown in FIG. 23B, with no p-type anode region being formed.

In Embodiment 6 too, in the same way as in Embodiment 5, the surface form of the depletion layer end 91 of the built-in depletion layer 90 is sufficiently near that of a planar junction, even when there is no p-type anode region 5-2, owing to the repetitive pitch of the trench 2 being sufficiently small. Further, by not forming the p-type anode region 5-2, the hole implantation efficiency from the p-type anode region 5-2 into the n$^-$-type drift region 1 can be reduced to practically 0 (zero) without causing a decrease in breakdown voltage or an increase in leakage current. When forming the anode electrode 59 using an aluminum-silicon (Al—Si) alloy, platinum silicide (PtSi), or the like, which have a high Schottky barrier, hole implantation from the p-type anode region 5-2 into the n$^-$-type drift region 1 occurs, because of which the hole implantation efficiency cannot be reduced to zero, but the hole implantation efficiency can be reduced to one-half or less compared with that when forming the p-type anode region 5-2.

Also, as shown in FIG. 23C, a shallow p-type layer 5-3, sufficiently shallower than the p-type anode region 5-2 of Embodiment 5 and of a low impurity concentration, may be formed as a modification example of Embodiment 6. In the case of a Schottky contact of the n$^-$-type drift region 1 and anode electrode 59, a depletion layer spreads with respect to surface defects (surface level) introduced partway through the element formation process, and carrier generation due to thermal excitation is liable to occur. Therefore, there is concern that leakage current will increase, and yield decrease. Therefore, by the shallow p-type layer 5-3 being formed as in the modification example of Embodiment 6 of FIG. 23C, the depletion layer can be prevented from coming into contact with the surface defects (surface level), because of which leakage current is stable at a low value, and yield decrease can be restricted.

The diode structures described in Embodiments 4 to 6 may also be applied to the FWD portion 22 of the semiconductor device in Embodiment 2. Also, the shallow p-type layer 5-3 in the modification example of Embodiment 6 may be formed in Embodiments 4 and 5. By so doing, the same advantages as in Embodiment 6 can be achieved.

As heretofore described, according to Embodiment 6, the same advantages as in Embodiments 3 to 5 can be obtained.

(Embodiment 7)

Figure 31:
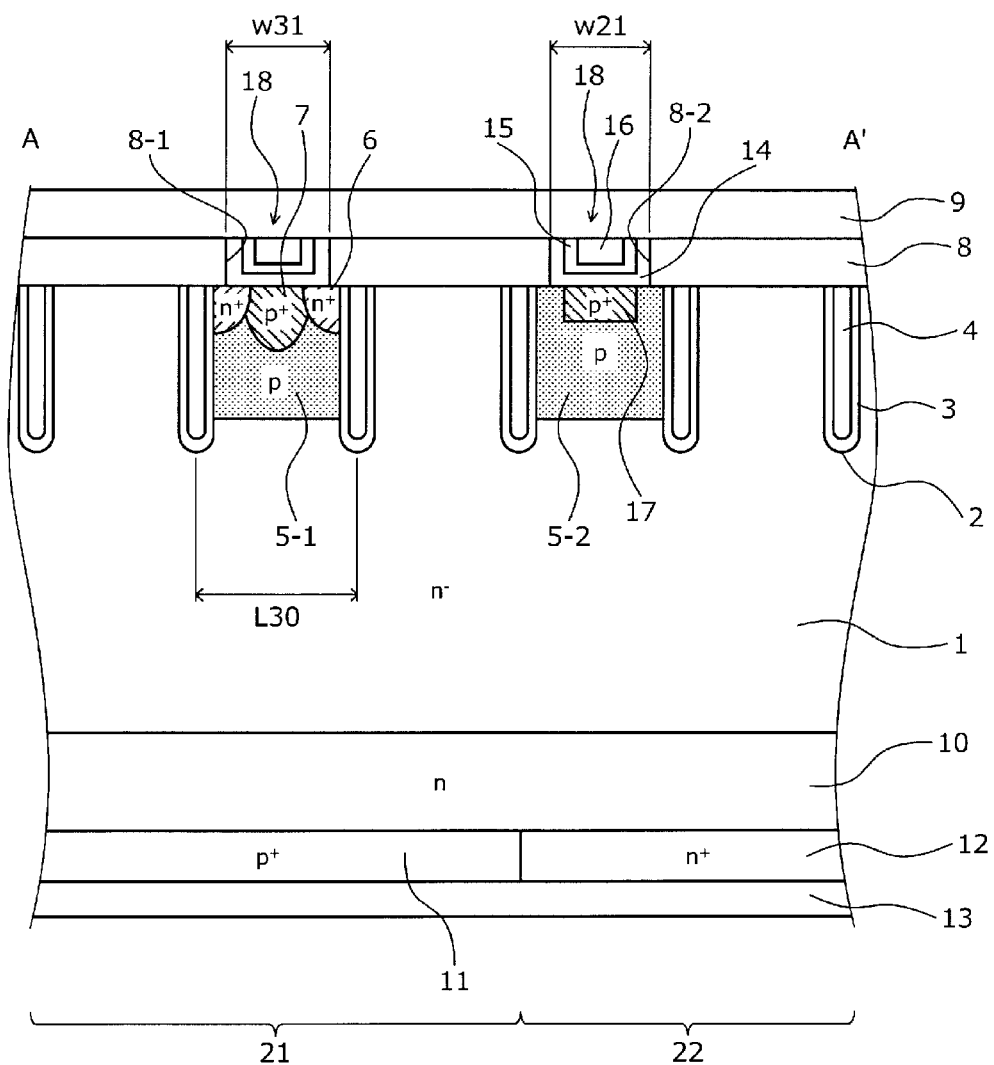
FIG. 31 is a sectional view showing the structure of a semiconductor device according to Embodiment 7.
Figure 32:
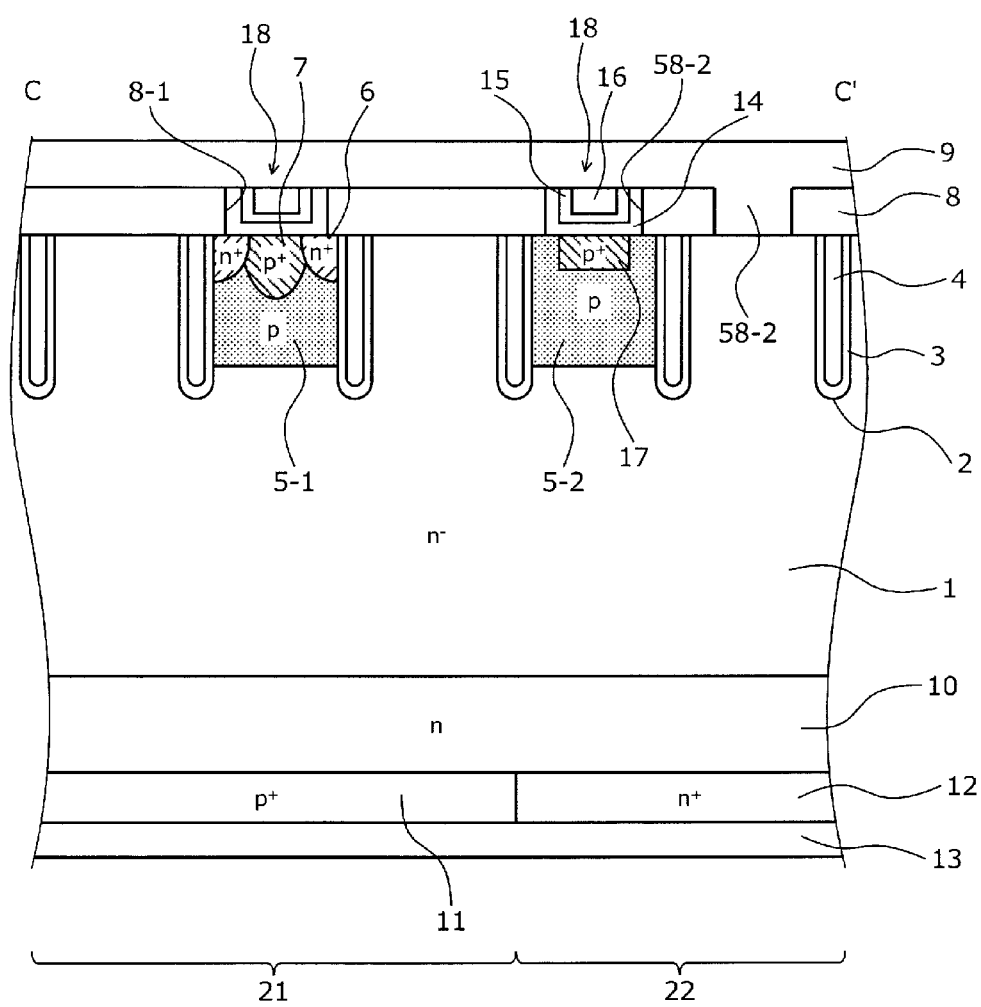
FIG. 32 is a sectional view showing the structure of another example of the semiconductor device according to Embodiment 7.
Figure 33:
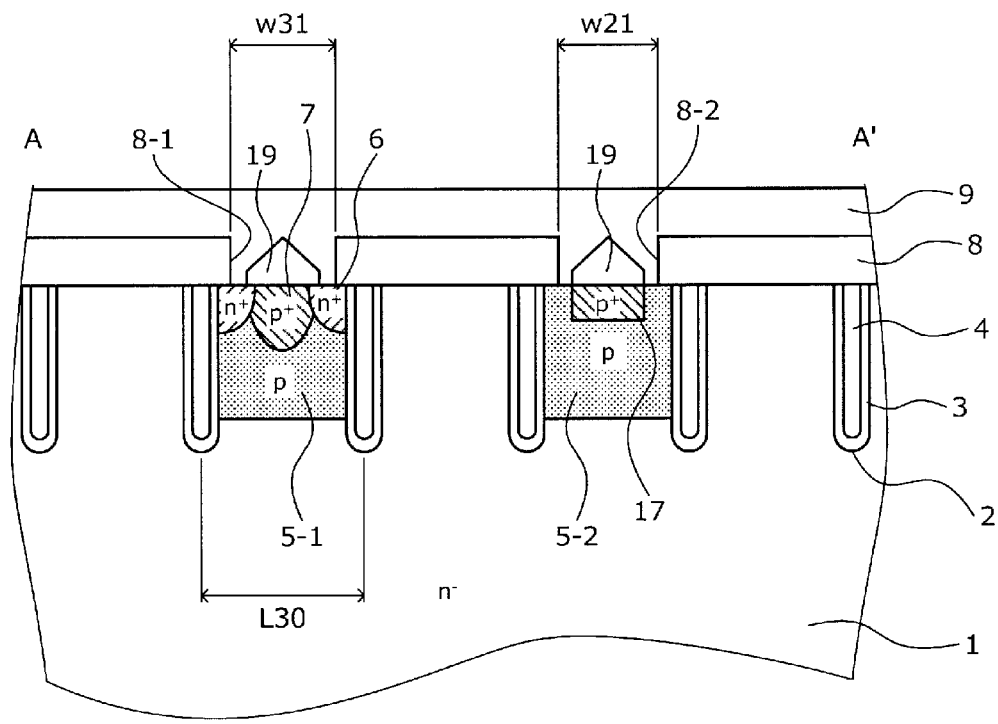
FIG. 33 is a sectional view showing the structure of a semiconductor device of a comparison example.

Next, a description will be given of the configuration of a semiconductor device according to Embodiment 7. FIG. 31 is a sectional view showing the structure of the semiconductor device according to Embodiment 7. The planar structure of the semiconductor device according to Embodiment 7 shown in FIG. 31 being the same as that of FIG. 1, FIG. 31 is the sectional structure along the cutting line A-A' of FIG. 1. FIG. 32 is a sectional view showing the structure of another example of the semiconductor device according to Embodiment 7. The planar structure of the other example of the semiconductor device according to Embodiment 7 shown in FIG. 32 being the same as that of FIG. 13, FIG. 32 is the sectional structure along the cutting line C-C' of FIG. 13. FIG. 33 is a sectional view showing the structure of a semiconductor device of a comparison example. The semiconductor device according to Embodiment 7 differs from the semiconductor device according to Embodiment 1 in that the p-type base region 5-1 and p-type anode region 5-2 are each electrically connected to the emitter electrode 9 via a contact electrode 18. The contact electrode 18 is formed by a titanium (Ti) layer 14, titanium nitride (TiN) layer 15, and tungsten (W) layer 16 being deposited sequentially from the front surface side of the substrate.

Specifically, as shown in FIG. 31, a $p^+$-type contact region 17 is selectively provided inside the p-type anode region 5-2. The $p^+$-type contact region 17 realizes ohmic contact (ohmic electrical contact) to the titanium layer 14. The $p^+$-type contact region 17 has a depth and impurity concentration differing from those of the $p^+$-type contact region 7 of the IGBT portion 21, and is adjusted (optimized) so that predetermined FWD characteristics based on design conditions are obtained. For example, it is preferable that the depth of the $p^+$-type contact region 17 is less than the depth of the $p^+$-type contact region 7, and that the impurity concentration of the $p^+$-type contact region 17 is lower than the impurity concentration of the $p^+$-type contact region 7. The reason for this is that when the $p^+$-type contact region 17 is formed in the p-type anode region 5-2 to a depth of the same extent as that of the $p^+$-type contact region 7 of the IGBT portion 21, and with a high impurity concentration, hole implantation from the p-type anode region 5-2 into the $n^-$-type drift region 1 increases too far when the FWD is in an on-state, and hard recovery occurs.

The contact electrode 18 is embedded inside each of, for example, the first and second contact holes 8-1 and 8-2. The contact electrode 18 realizes good ohmic contact, even when an aperture width w31 in the trench 2 lateral direction of the first contact hole 8-1 and the aperture width w21 in the trench 2 lateral direction of the second contact hole 8-2 are small due to a repetitive pitch L30 of the trench 2 being small at, for example, 4 μm or less. For example, when the contact electrode 18 is not included, as in the comparison example shown in FIG. 33, the aperture width w31 in the trench 2 lateral direction of the first contact hole 8-1 and the aperture width w21 in the trench 2 lateral direction of the second contact hole 8-2 are small due to the repetitive pitch L30 of the trench 2 being small. Therefore, the interiors of the first and second contact holes 8-1 and 8-2 cannot be completely filled by only the emitter electrode 9, which is formed of an aluminum-silicon film. Therefore, a gap 19 occurs between the emitter electrode 9 and the silicon portion (at least the $p^+$-type contact region 7 of the IGBT portion 21, and the p-type anode region 5-2 of the FWD portion 22), and contact resistance increases, because of which it is difficult to obtain good ohmic contact between the emitter electrode 9 and silicon portion.

Meanwhile, the invention is such that the interiors of the first and second contact holes 8-1 and 8-2 can be completely filled by the contact electrode 18 formed of the titanium layer 14, titanium nitride layer 15, and tungsten layer 16. Therefore, the gap 19 can be prevented from occurring between the emitter electrode 9 and silicon portion. Specifically, the titanium layer 14 is provided along the side walls and substrate front surface inside each of the first and second contact holes 8-1 and 8-2. The titanium layer 14 is in contact with the $n^+$-type emitter region 6 and $p^+$-type contact region 7 in the IGBT portion 21, and in contact with the p-type anode region 5-2 and $p^+$-type contact region 17 in the FWD portion 22. The titanium nitride layer 15 is provided along the titanium layer 14, on the inner side of the titanium layer 14, inside the first and second contact holes 8-1 and 8-2, and the tungsten layer 16 is provided on the inner side of the titanium nitride layer 15. The emitter electrode 9 is in contact with the titanium layer 14, titanium nitride layer 15, and tungsten layer 16.

Also, for example, when the gate electrode 4 in the FWD portion 22 is of the gate potential, it has been confirmed by the inventors that, when attempting a reduction in on-state voltage in the IGBT portion by reducing the repetitive pitch L30 of the trench 2 to, for example, 4 μm or less, the forward voltage when gate voltage is applied rises considerably. For example, when applying a commonly used gate voltage of 15V, the rate of rise of the forward voltage, compared to when no gate voltage is applied (=0V), is in the region of 3% when the repetitive pitch L30 of the trench 2 is 5 μm, in the region of 10% when the repetitive pitch L30 of the trench 2 is 4 μm, and in the region of 21% when the repetitive pitch L30 of the trench 2 is 2.3 μm. Also, the rate of rise of the forward voltage increases in proportion to the size of the gate voltage. The reason for this is as follows. When gate voltage is applied, electrons concentrate in the periphery of the trench 2, because of which hole implantation from the p-type anode region 5-2 into the $n^-$-type drift region 1 is restricted by the electrons concentrated in the periphery of the trench 2 in the FWD portion 22. The more the repetitive pitch L30 of the trench 2 is reduced, the smaller the width in the trench 2 lateral direction (the portion indicated by reference sign w20 in FIG. 1) of the p-type anode region 5-2 becomes, because of which the proportion of hole implantation from the p-type anode region 5-2 into the $n^-$-type drift region 1 restricted by the electrons concentrated in the periphery of the trench 2 increases, and conductivity modulation does not progress.

Therefore, applying Embodiment 3 to Embodiment 7, the gate electrode 4 in the FWD portion 22 and the emitter electrode 9 may be conductively connected. Owing to the gate electrode 4 in the FWD portion 22 and the emitter electrode 9 being conductively connected, electrons do not concentrate in the periphery of the trench 2 in the FWD portion 22 when gate voltage is applied. Therefore, even when the repetitive pitch L30 of the trench 2 is miniaturized, hole implantation from the p-type anode region 5-2 into the $n^-$-type drift region 1 is not restricted by electrons, because of which the forward voltage can be reduced. Also, as shown in FIG. 32, Embodiment 7 may be applied to Embodiment 2. Specifically, even when practically the whole of a mesa portion between neighboring trenches 2 in the FWD portion 22 is exposed in the second contact hole 58-2, the $p^+$-type contact region 17 may be provided inside the p-type anode region 5-2, and the emitter electrode 9 and $p^+$-type contact region 17 connected via the contact electrode 18. In this way, good ohmic contact to the silicon portion can be realized by the contact electrode 18, regardless of the planar form of the second contact hole 58-2.

As heretofore described, according to Embodiment 7, the same advantages as in Embodiments 1 and 2 can be obtained. According to Embodiment 7, even when attempting a reduction in on-state voltage by reducing the repetitive pitch of the trench to, for example, 4 μm or less, a rise in the forward voltage when gate voltage is applied can be restricted, and good ohmic contact can be realized on the anode side of the FWD portion.

The invention not being limited by the heretofore described embodiments, various changes are possible without departing from the scope of the invention. For example, the dimensions, surface concentrations, and the like of each portion in each of the heretofore described embodiments are variously set in accordance with the required specifications or the like. Also, in each embodiment, a first conductivity type is taken to be n-type and a second conductivity type is taken to be p-type, but the invention is established in the same way when the first conductivity type is p-type and the second conductivity type is n-type.

INDUSTRIAL APPLICABILITY

As heretofore described, the semiconductor device according to the invention is useful in a power semiconductor device used in a power conversion device or the like.

REFERENCE SIGNS LIST 1 n$^-$-type drift region
2 Trench
3 Gate insulating film
4, 54 Gate electrode
5-1 p-type base region
5-2 p-type anode region
6 n$^+$-type emitter region
6-1 n$^+$-type emitter region configuration portion (first n$^+$-type region)
6-2 n$^+$-type emitter region configuration portion (second n$^+$-type region)
7 p$^+$-type contact region
8 interlayer dielectric
8-1 IGBT portion contact hole (first contact hole)
8-2 FWD portion contact hole (second contact hole)
9 Emitter electrode
10 n-type buffer layer
11 p$^+$-type collector region
12 n$^+$-type cathode region
13 Collector electrode
21 IGBT portion
22 FWD portion
Lc Unit length
Lp Width in trench longitudinal direction of p-type anode region (not including an increase caused by thermal diffusion)
Ln Width in trench longitudinal direction of portion of n$^-$-type drift region sandwiched by p-type anode region (not including an increase caused by thermal diffusion)
w10 Width in trench longitudinal direction of p-type anode region
w20 Width in trench lateral direction of p-type anode region (mesa width)
w11 Aperture width in trench longitudinal direction of second contact hole
w21 Aperture width in trench lateral direction of second contact hole
x11 Width in trench longitudinal direction of p-type base region
x12 Width in trench longitudinal direction of portion of n$^-$-type drift region sandwiched by p-type base region
α Anode ratio

What is claimed is:

1. A semiconductor device comprising a first element region in which an insulated gate bipolar transistor is provided and a second element region in which a diode is provided on a semiconductor substrate that forms a first conductivity type drift region, the semiconductor device further comprising:
    a plurality of trenches provided in stripe form extending in a trench longitudinal direction perpendicular to a direction in which the first element region and second element region are aligned from the first element region across the second element region in a front surface of the semiconductor substrate;
    a gate insulating film provided along side walls and bottom surfaces of the trenches;
    a gate electrode provided on an inner side of the gate insulating film inside the trenches;
    a second conductivity type base region selectively provided in a mesa portion between neighboring trenches of the first element region;
    a second conductivity type anode region selectively provided in the mesa portion between neighboring trenches of the second element region;
    a first conductivity type emitter region selectively provided inside the base region;
    a first electrode in contact with the base region, emitter region, and anode region;
    a second conductivity type collector region provided on a back surface of the semiconductor substrate in the first element region;
    a first conductivity type cathode region provided on the back surface of the semiconductor substrate in the second element region; and
    a second electrode in contact with the collector region and cathode region, wherein
    the anode region and drift region are repeatedly, alternately disposed in the trench longitudinal direction in a top surface of the mesa portion between neighboring trenches of the second element region.

2. The semiconductor device according to claim 1, wherein built-in depletion layers spreading into the mesa portion from each of neighboring anode regions are linked to each other.

3. The semiconductor device according to claim 1, wherein
    the first electrode is further in contact with the drift region in the second element region, and
    a proportion occupied by the anode region of a unit region formed of the anode region and the drift region in a portion sandwiched by the anode region and the anode region neighboring the anode region in the trench longitudinal direction is less than 50%.

4. The semiconductor device according to claim 3, wherein the drift region and the first electrode form a Schottky junction.

5. A semiconductor device comprising:
    an insulated gate bipolar transistor (IGBT) region;
    a diode region adjacent to the IGBT region;
    wherein the diode region includes parallel trenches and a repeating pattern of an anode region alternating with a drift region on a surface between the parallel trenches, and a unit region in the diode region is defined as an anode region and an adjacent drift region on the surface between the parallel trenches.

6. A semiconductor device according to claim 5, wherein a first electrode is in contact with the drift region in the diode region, and an anode ratio, defined as a ratio of a dimension of the anode region of the unit region to a dimension of the unit region as a whole, is less than 50%.

7. The semiconductor device of claim 6, wherein an anode region and a drift region are connected to a common emitter electrode.

8. The semiconductor device according to claim 1, wherein the drift region in the top surface of the mesa portion is covered by an insulator film, and a proportion occupied by the anode region of a unit region formed of the anode region and the drift region in a portion sandwiched by the anode region and the anode region neighboring the anode region in the trench longitudinal direction is 50% or more and less than 100%.

9. The semiconductor device of claim 5, wherein the drift region between the surface of the parallel trenches is covered by an insulator film, and an anode ratio, defined as a ratio of a dimension of the anode region of the unit region to a dimension of the unit region as a whole, is 50% or more and less than 100%.

10. The semiconductor device of claim 7, wherein the drift region and the first electrode form a Schottky junction.

11. The semiconductor device of claim 9, wherein the anode ratio is between substantially 50% and substantially 75%.

12. The semiconductor device of claim 9, wherein the anode ratio is substantially 75%.

* * * * *